(12) United States Patent
Nomura

(10) Patent No.: US 11,043,935 B2
(45) Date of Patent: Jun. 22, 2021

(54) LVDS DRIVER CIRCUIT, INTEGRATED CIRCUIT DEVICE, OSCILLATOR, ELECTRONIC APPARATUS, AND VEHICLE

(71) Applicant: Seiko Epson Corporation, Tokyo (JP)

(72) Inventor: Masataka Nomura, Minowa (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 16/837,307

(22) Filed: Apr. 1, 2020

(65) Prior Publication Data

US 2020/0321944 A1    Oct. 8, 2020

(30) Foreign Application Priority Data

Apr. 2, 2019 (JP) .............................. JP2019-070375

(51) Int. Cl.
*H03K 3/012* (2006.01)
*H03B 5/36* (2006.01)

(52) U.S. Cl.
CPC .............. *H03K 3/012* (2013.01); *H03B 5/36* (2013.01)

(58) Field of Classification Search
CPC ..................................................... H03K 3/012
USPC ......................................................... 331/74
See application file for complete search history.

(56) References Cited

U.S. PATENT DOCUMENTS

| 4,564,821 | A | * | 1/1986 | Reichart | ............ | G01R 19/1658 |
|||||||327/50|
| 6,316,964 | B1 | | 11/2001 | Watarai | | |
| 2003/0098749 | A1 | * | 5/2003 | Terasawa | ............. | H03K 5/1565 |
|||||||331/74|
| 2005/0093579 | A1 | | 5/2005 | Yamaguchi | | |
| 2006/0158271 | A1 | * | 7/2006 | Juang | ....................... | H03B 5/04 |
|||||||331/74|
| 2006/0197616 | A1 | * | 9/2006 | Chen | .................... | H03K 3/0307 |
|||||||331/74|
| 2014/0292425 | A1 | * | 10/2014 | Kozaki | ............ | H03K 19/00384 |
|||||||331/74|

FOREIGN PATENT DOCUMENTS

| JP | 2000-174605 A | 6/2000 |
| JP | 2005-109897 A | 4/2005 |

* cited by examiner

*Primary Examiner* — Joseph Chang
(74) *Attorney, Agent, or Firm* — Harness, Dickey & Pierce, P.L.C.

(57) ABSTRACT

An LVDS driver circuit includes: a current source; a differential unit configured to receive a first input signal and a second input signal and output a first output signal and a second output signal; and a feedback control circuit configured to be coupled to a first output node and a second output node and to perform, by outputting a control voltage to a gate of a transistor, feedback control that sets a common voltage of a differential output signal. In the differential unit, the first output node and the second output node are in a high impedance state in the high impedance mode, the differential unit is configured to output the first output signal and the second output signal in the signal output mode, and the control voltage in the high impedance mode is larger than the control voltage in the signal output mode.

15 Claims, 15 Drawing Sheets

LVDS DRIVER CIRCUIT, INTEGRATED CIRCUIT DEVICE, OSCILLATOR, ELECTRONIC APPARATUS, AND VEHICLE

The present application is based on, and claims priority from JP Application Serial Number 2019-070375, filed Apr. 2, 2019, the disclosure of which is hereby incorporated by reference herein in its entirety.

BACKGROUND

1. Technical Field

The present disclosure relates to an LVDS driver circuit, an integrated circuit device, an oscillator, an electronic apparatus, and a vehicle.

2. Related Art

In the related art, an LVDS driver circuit that outputs a signal by a signal system of low voltage differential signaling (LVDS) is known. JP-A-2005-109897 discloses an LVDS driver circuit configured to enable a logic output and a high impedance output such that an output waveform is not distorted even when different termination resistors are used. The LVDS driver circuit includes a constant current source, an output switching circuit that sets an output state, and a bypass circuit that bypasses a current from the constant current source during a high impedance output, and sets a potential of an intermediate node of the bypass circuit to a termination voltage.

In the LVDS driver circuit of JP-A-2005-109897, since a current continues to flow via the bypass circuit even during a high impedance output, power consumption during the high impedance output that does not output a signal may increase.

SUMMARY

An aspect of the present disclosure relates to an LVDS driver circuit having a high impedance mode and a signal output mode. The LVDS driver circuit includes: a current source configured to supply a current; a differential unit provided between the current source and a first node, and configured to receive a first input signal and a second input signal that constitute a differential input signal and to output a first output signal and a second output signal that constitute a differential output signal; a transistor provided between the first node and a ground node; and a feedback control circuit configured to be coupled to a first output node from which the first output signal is output and to a second output node from which the second output signal is output, and configured to perform, by outputting a control voltage to a gate of the transistor, feedback control that sets a common voltage of the differential output signal, in which in the differential unit, the first output node and the second output node are in a high impedance state in the high impedance mode, the differential unit is configured to output the first output signal and the second output signal in the signal output mode, and the control voltage in the high impedance mode is larger than the control voltage in the signal output mode.

DESCRIPTION OF EXEMPLARY EMBODIMENTS

Hereinafter, embodiments will be described. Note that the following embodiments are not intended to unduly limit the scope of the appended claims. Further, not all components described in the embodiments are essential components.

1. LVDS Driver Circuit

Figure 1:
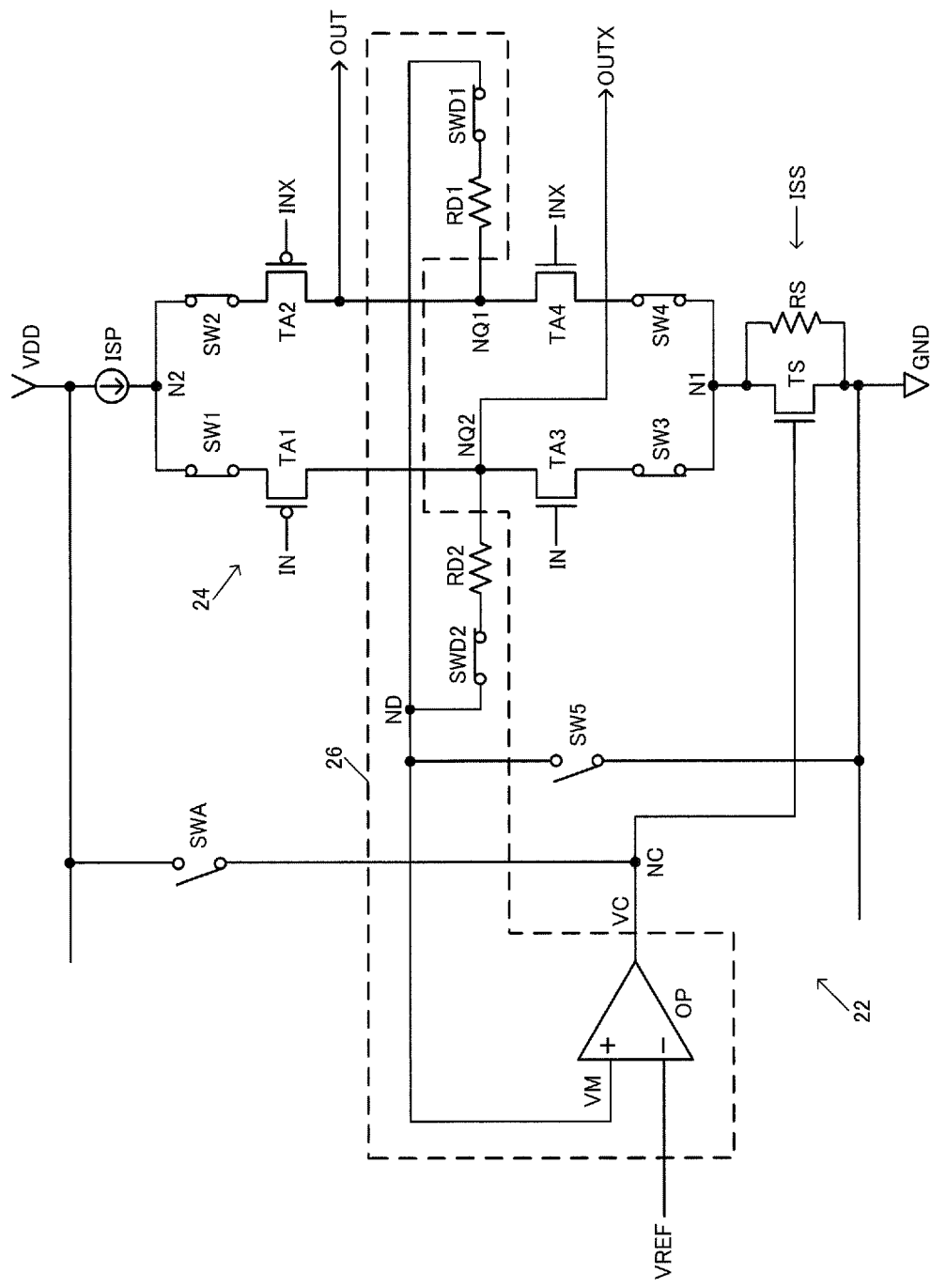
FIG. 1 is an explanatory diagram of a signal output mode of a first configuration example of an LVDS driver circuit.
Figure 2:
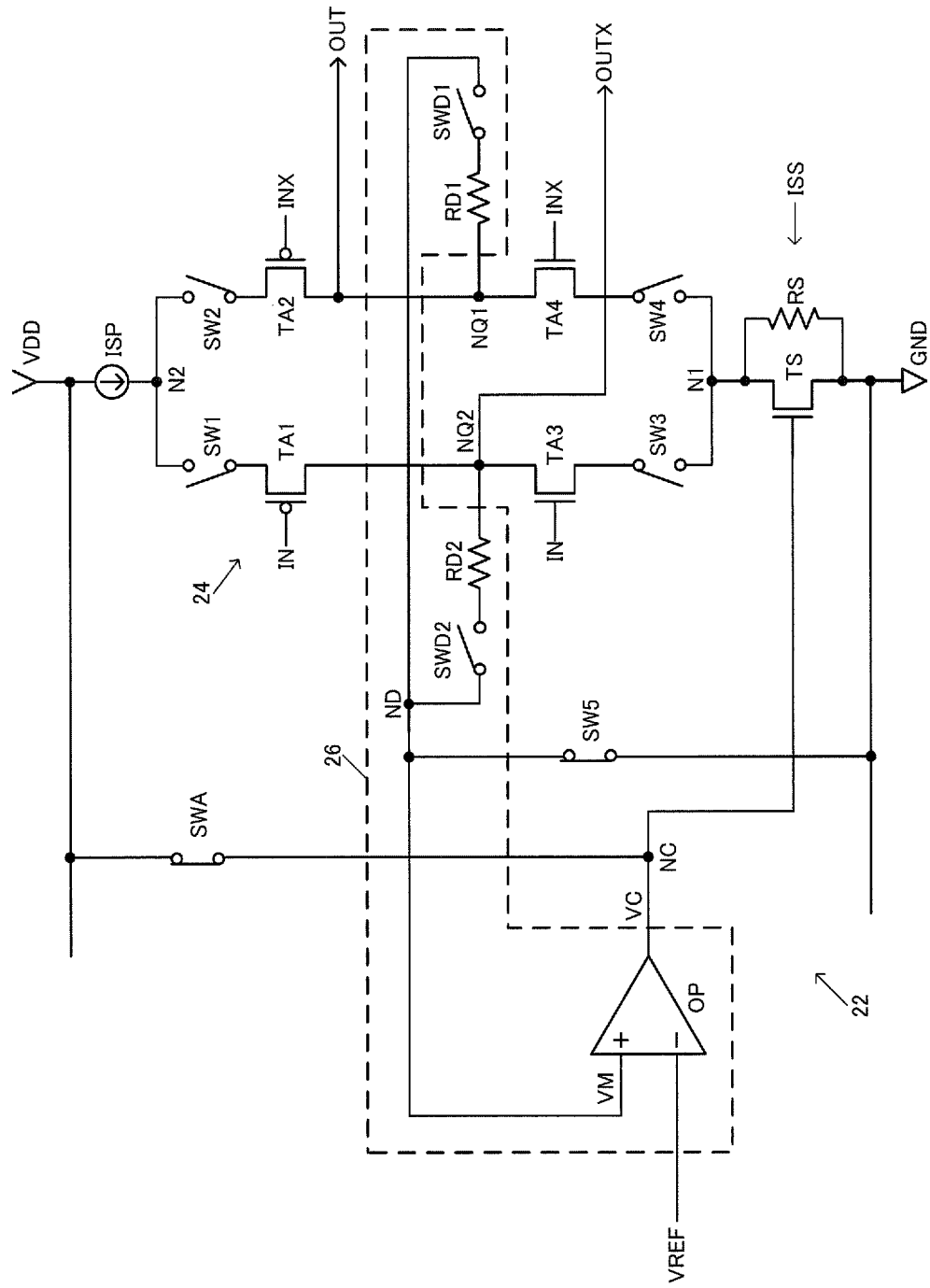
FIG. 2 is an explanatory diagram of a high impedance mode of the first configuration example of the LVDS driver circuit.

FIGS. 1 and 2 show a first configuration example of an LVDS driver circuit 22 in the present embodiment. The LVDS driver circuit 22 in the present embodiment has a signal output mode and a high impedance mode. FIG. 1 shows a state in the signal output mode, and FIG. 2 shows a state in the high impedance mode.

The LVDS driver circuit 22 in FIGS. 1 and 2 includes a current source ISP that supplies a current, a differential unit 24, a transistor TS, a feedback control circuit 26, and switches SWA and SW5.

The current source ISP is provided between a node of a VDD that is a power supply voltage and a node N2, and supplies a current to the differential unit 24. The current source ISP can be implemented by, for example, a P-type transistor whose gate receives a bias voltage.

The differential unit 24 is provided between the current source ISP and a node N1. The node N1 is a first node. Specifically, the differential unit 24 is provided between the node N2 that is a current supply node of the current source ISP, and the node N1 to which a drain of the transistor TS is coupled. The differential unit 24 includes, for example, transistors TA1, TA2, TA3, and TA4. Further, the differential unit 24 can include switches SW1, SW2, SW3, and SW4. The differential unit 24 receives an input signal IN and an input signal INX that constitute a differential input signal, and outputs an output signal OUT and an output signal OUTX that constitute a differential output signal. The input signals IN and INX are a first input signal and a second input signal, respectively. The output signals OUT and OUTX are a first output signal and a second output signal, respectively. The input signal IN and the input signal INX constitute the differential input signal and are transmitted in a balanced manner. The output signal OUT and the output signal OUTX constitute the differential output signal and are transmitted in a balanced manner. For example, the input signal IN and the output signal OUT are on a positive polarity side, and the input signal INX and the output signal OUTX are on a negative polarity side. Here, X indicates negative logic.

Here, the output signals OUT and OUTX are, for example, clock signals. For example, the differential output signal is a differential output clock signal. The output signals OUT and OUTX are a first output clock signal and a second output clock signal, respectively. However, the output signals OUT and OUTX may be data signals. For example, the differential output signal may be a differential output data signal. The output signals OUT and OUTX may be a first output data signal and a second output data signal.

The transistor TS is provided between the node N1 and a ground node. For example, the transistor TS is an N-type transistor. The drain is coupled to the node N1, and a source is coupled to the ground node. Further, a control voltage VC output from the feedback control circuit 26 is input to a gate of the transistor TS. Here, the ground node is a node to which a ground voltage is supplied. The ground voltage is, for example, a ground potential. In the present embodiment, ground is appropriately referred to as GND. GND can also be referred to as VSS.

The LVDS driver circuit 22 can include, between the node N1 and the ground node, a resistor RS provided in parallel with the transistor TS. For example, one end of the resistor RS is coupled to the drain of the transistor TS, and the other end of the resistor RS is coupled to the source of the transistor TS. A sink current source ISS includes the transistor TS and the resistor RS. Accordingly, the sink current source ISS can be implemented in which an on-resistance of the transistor TS and a resistance value of the resistor RS become a combined resistance.

The feedback control circuit 26 is coupled to an output node NQ1 from which the output signal OUT is output and an output node NQ2 from which the output signal OUTX is output. The output node NQ1 is a first output node, and the output node NQ2 is a second output node. The feedback control circuit 26 outputs the control voltage VC to the gate of the transistor TS, thereby performing feedback control that sets a common voltage VOS of the differential output signal including the output signals OUT and OUTX.

Figure 3:
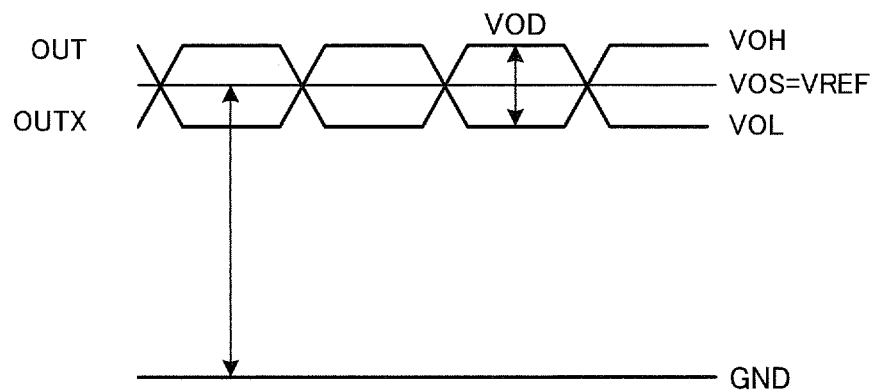
FIG. 3 is an explanatory diagram of a signal waveform of a differential output signal of LVDS.

For example, FIG. 3 shows a signal waveform example of the differential output signal of the LVDS. The differential output signal of the LVDS including the output signals OUT and OUTX is a signal having the common voltage VOS based on the GND as a center voltage, and having an amplitude VOD of, for example, 0.35 V. The common voltage is, for example, VOS=1.25 V. In the LVDS, an external load (not shown) of 100 is coupled between the output node NQ1 of the output signal OUT and the output node NQ2 of the output signal OUTX. When a current of 3.5 mA from the current source ISP flows to the external load of 100 Ω, the amplitude VOD of the differential output signal is 0.35 V.

The feedback control circuit 26 performs, using a reference voltage VREF that sets the common voltage VOS in FIG. 3, feedback control such that an intermediate voltage between a voltage of the output node NQ1 and a voltage of the output node NQ2 of the differential unit 24 is the common voltage VOS. In this way, the common voltage VOS is set based on the reference voltage VREF, and the differential output signal of the LVDS having the common voltage VOS as the center voltage can be output.

The LVDS driver circuit 22 in the present embodiment has the signal output mode and the high impedance mode. FIG. 1 shows the state in the signal output mode, and FIG. 2 shows the state in the high impedance mode. When a signal transmitted by the LVDS is the clock signal, the signal output mode is a clock output mode. When a signal transmitted by the LVDS is a data signal, the signal output mode is a data output mode.

Specifically, the differential unit 24 outputs the output signals OUT and OUTX as shown in FIG. 3 in the signal output mode in FIG. 1. At this time, as shown in FIG. 1, the switches SW1, SW2, SW3, and SW4 of the differential unit 24 are all turned on.

In the signal output mode, when the input signal IN is at an H level (High level) and the input signal INX is at an L level (Low level), the P-type transistor TA2 and the N-type transistor TA3 of the differential unit 24 are turned on. Accordingly, the current of 3.5 mA from the current source ISP flows, via the external load (not shown) of 100 Ω, from the transistor TA2 to the transistor TA3. As a result, the output signal OUT is at a voltage level VOH on a high potential side in FIG. 3, and the output signal OUTX is at a voltage level VOL on a low potential side. Here, the common voltage VOS corresponds to an intermediate voltage between the VOH and the VOL.

In the signal output mode, when the input signal IN is at the L level and the input signal INX is at the H level, the P-type transistor TA1 and the N-type transistor TA4 of the differential unit 24 are turned on. Accordingly, the current of 3.5 mA from the current source ISP flows, via the external load of 100 Ω, from the transistor TA1 to the transistor TA4. As a result, the output signal OUT is at the voltage level VOL on the low potential side in FIG. 3, and the output signal OUTX is at the voltage level VOH on the high potential side.

On the other hand, in the differential unit 24, the output nodes NQ1 and NQ2 are in a high impedance state in the high impedance mode in FIG. 2. That is, the differential unit 24 is in an output high impedance state where the output nodes NQ1 and NQ2, which are output terminals of the output signals OUT and OUTX, are in the high impedance state. Specifically, as shown in FIG. 2, the switches SW1, SW2, SW3, and SW4 of the differential unit 24 are all turned off. By setting the LVDS driver circuit 22 to such a high impedance mode, since the current from the current source ISP does not flow to the external load, power consumption can be reduced, and power saving of the LVDS driver circuit 22 can be implemented. Further, by setting the LVDS driver circuit 22 to the high impedance mode, it is possible to operate other driver circuits such as PECL, HCSL, or a differential CMOS of an output driver 46 to be described below with reference to FIGS. 12 to 15. The setting to the high impedance mode is not necessarily limited to the configuration using the switches SW1, SW2, SW3, and SW4, and may also be implemented by, for example, controlling gate voltages of the transistors TA1, TA2, TA3, and TA4.

As described above, in the present embodiment, the feedback control circuit 26 outputs the control voltage VC to the gate of the transistor TS provided as the sink current source ISS, thereby performing the feedback control that sets the common voltage VOS of the output signals OUT and OUTX. That is, the feedback control is performed which sets the intermediate voltage between the voltage of the output signal OUT and the voltage of the output signal OUTX to the common voltage VOS. On the other hand, the differential unit 24 outputs the output signals OUT and OUTX in the signal output mode in FIG. 1, and enters the output high impedance state in the high impedance mode in FIG. 2.

Figure 6:
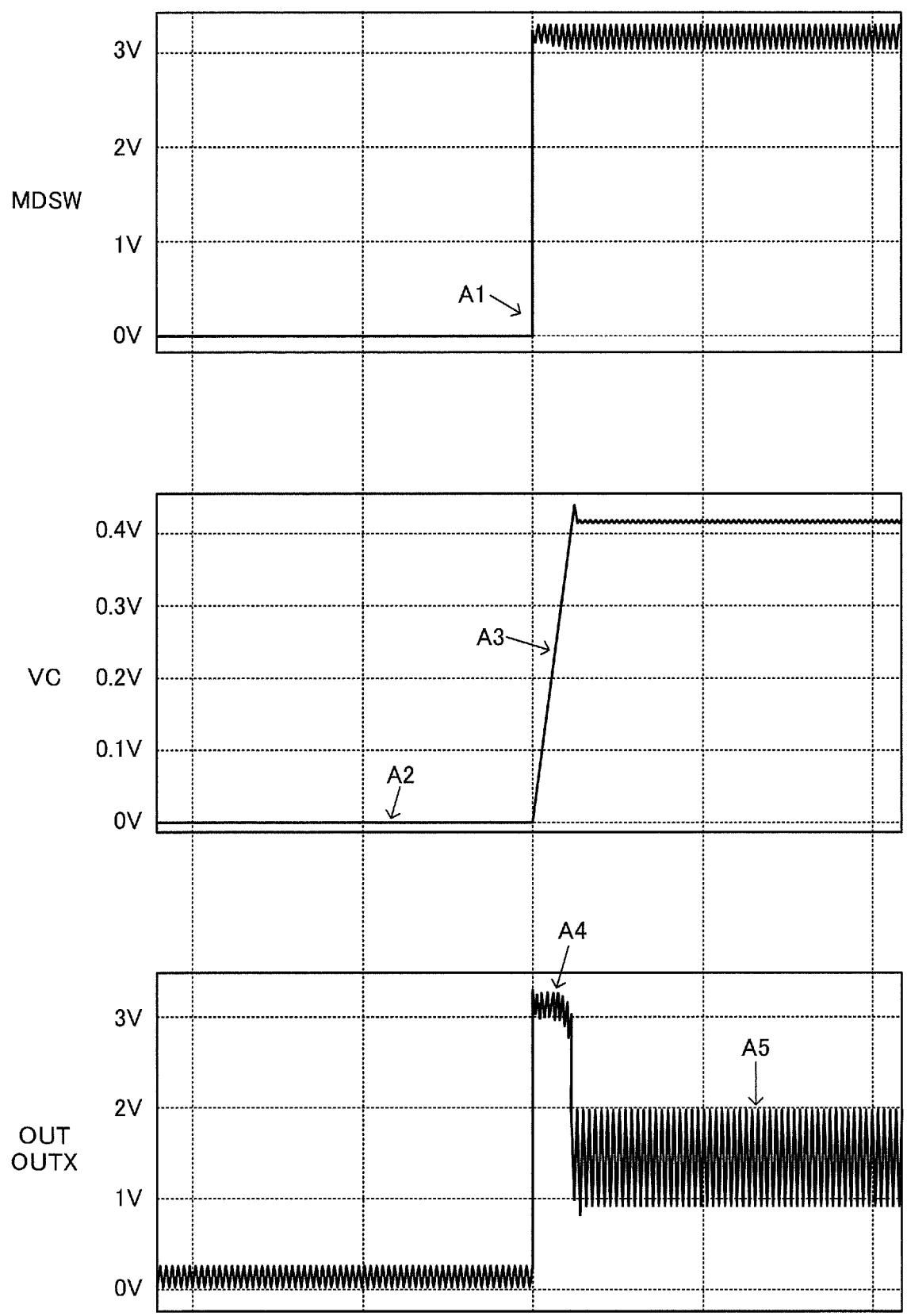
FIG. 6 shows a signal waveform example illustrating an operation of the LVDS driver circuit of the comparative example.

As will be described in detail below with reference to FIG. 6, it is found that there is a problem that an overshoot occurs in waveforms of the output signals OUT and OUTX immediately after switching the mode from the high impedance mode in FIG. 2 to the signal output mode in FIG. 1. For example, an overshoot as shown in A4 of FIG. 6 occurs. For example, the overshoot occurs in which voltage levels of the output signals OUT and OUTX jump up to near the power supply voltage. When such an overshoot occurs, for example, a maximum rating may be exceeded in an integrated circuit device including a reception circuit that receives the output signals OUT and OUTX.

Such an overshoot occurs because, in the high impedance mode, the control voltage VC output from the feedback control circuit 26 is at a low potential voltage level such as a level of the ground voltage, and the transistor TS that constitutes the sink current source ISS is turned off.

That is, in the signal output mode, the feedback control circuit 26 performs the feedback control such that the intermediate voltage of the output signals OUT and OUTX is set to the common voltage VOS. That is, by controlling the current that flows to the transistor TS of the sink current source ISS with the control voltage VC output from the feedback control circuit 26, the feedback control is performed which sets the intermediate voltage of the output signals OUT and OUTX to the common voltage VOS.

However, in the high impedance mode, the control voltage VC output from the feedback control circuit 26 is at the low potential voltage level such as the level of the ground voltage, and the feedback control as described above does not work. Therefore, since a sufficient current does not flow to the sink current source ISS when the transistor TS is turned off, the voltage levels of the output signals OUT and OUTX are raised to the voltage level on the high potential side by the P-type transistors TA1, TA2 and the like. As a result, as shown in A4 of FIG. 6, the overshoot occurs in which the voltage levels of the output signals OUT and OUTX jump up to near a voltage level of the VDD that is the power supply voltage. When the feedback control performed by the feedback control circuit 26 works normally, as shown in A5 of FIG. 6, the voltage levels of the output signals OUT and OUTX return to a state of the normal voltage level as shown in FIG. 3, but it takes time for the feedback control to work normally. As a result, there is a problem that a maximum rating level of the integrated circuit device on a reception side is exceeded due to the overshoot of A4 in FIG. 6.

Figure 7:
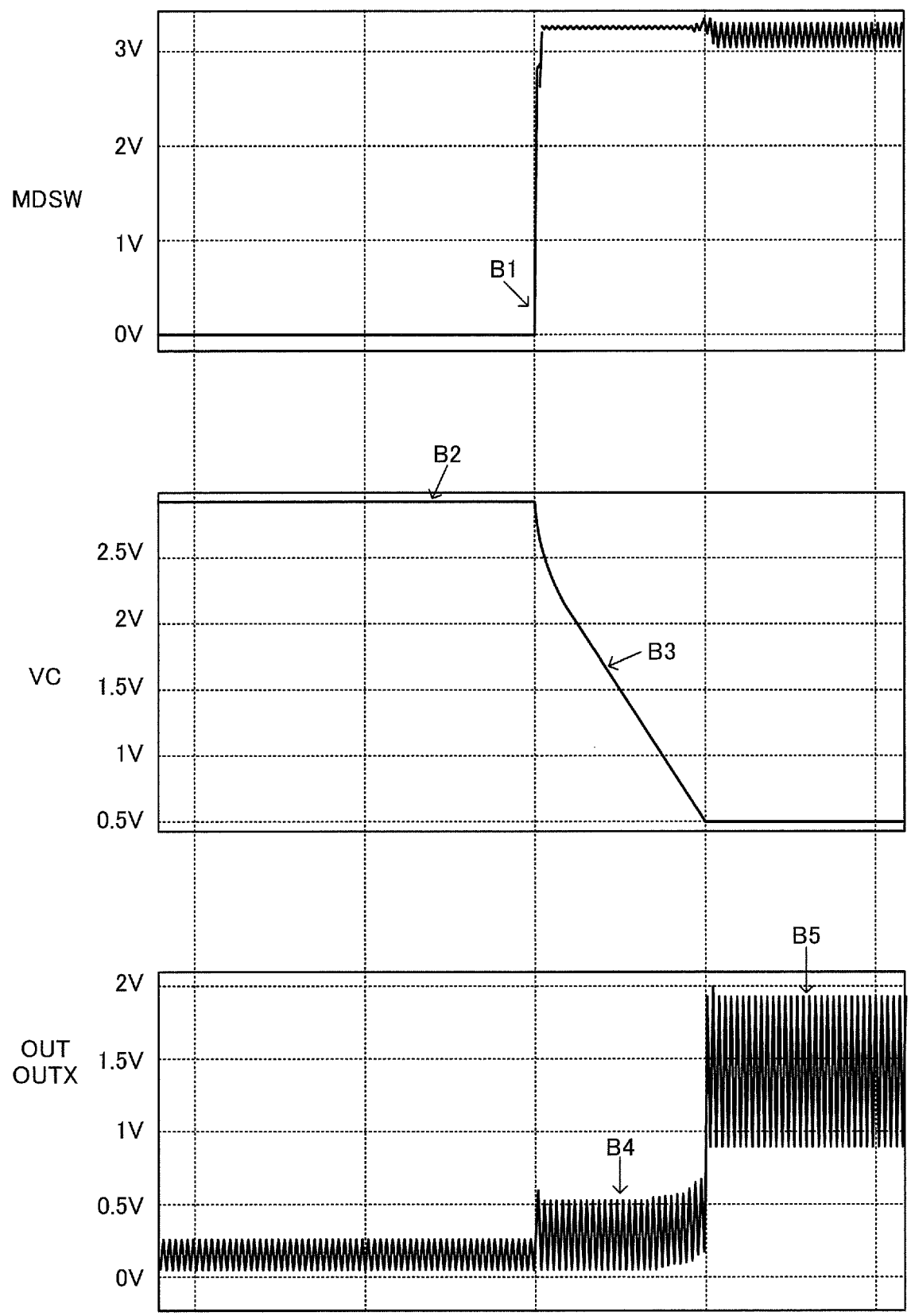
FIG. 7 shows a signal waveform example illustrating an operation of the LVDS driver circuit according to the present embodiment.

Therefore, in the present embodiment, the control voltage VC in the high impedance mode is set to be larger than the control voltage VC in the signal output mode. For example, B2 in FIG. 7 to be described below indicates the control voltage VC in the high impedance mode, and B4 indicates the control voltage VC in the signal output mode. In the present embodiment, the control voltage VC in the high impedance mode shown in B2 of FIG. 7 is larger than the control voltage VC in the signal output mode shown in B4.

When the control voltage VC in the high impedance mode is increased in this way, the transistor TS whose gate receives the control voltage VC is turned on. That is, the transistor TS can be turned on during a period from a timing of switching the mode from the high impedance mode to the signal output mode to a timing when the feedback control performed by the feedback control circuit 26 works normally. Accordingly, a sufficient current flows to the transistor TS of the sink current source ISS during the period, so that the voltage levels of the output signals OUT and OUTX can be effectively prevented from being raised to the voltage level on the high potential side by the P-type transistors TA1, TA2 and the like. As a result, the overshoot as shown in A4 of FIG. 6 can be prevented, and an appropriate operation of the LVDS driver circuit 22 may be implemented.

Specifically, in the first configuration example of FIGS. 1 and 2, the switch SWA is provided between a power supply node of the VDD and an output node NC of the control voltage VC of the feedback control circuit 26. The switch SWA is turned on as shown in FIG. 2 in the high impedance mode and is turned off as shown in FIG. 1 in the signal output mode. The ON or OFF control of the switch SWA is performed by, for example, a control circuit 50 in FIG. 11 to be described below. That is, the ON or OFF of the switch SWA is controlled based on a control signal from the control circuit 50.

In this way, in the high impedance mode, the switch SWA is turned on, so that the output node NC of the control voltage VC is electrically coupled to the power supply node of the VDD via the switch SWA. Accordingly, as shown in B2 of FIG. 7, in the high impedance mode, the control voltage VC is set to a power supply voltage level of the VDD. Therefore, the transistor TS whose gate receives the control voltage VC is turned on, and a current flows to a ground side via the transistor TS. As a result, occurrence of the overshoot as shown in A4 of FIG. 6 is prevented.

In an LVDS driver circuit of JP-A-2005-109897 described above, since a current continues to flow via a bypass circuit even in a high impedance mode, there is a problem that power saving in the high impedance mode cannot be implemented. On the contrary, in the present embodiment, in the high impedance mode, when the switches SW1, SW2, SW3, and SW4 are turned off, for example, as shown in FIG. 2, a current from the current source ISP does not flow to the external load, and a current from the external load also does not flow to the sink current source ISS. Therefore, there is an advantage that an unnecessary current does not flow in the high impedance mode, and power saving in the high impedance mode can be implemented.

2. Feedback Control Circuit, Differential Unit, and Operational Amplifier

Next, the configuration of the feedback control circuit 26 will be described in detail. The feedback control circuit 26 of FIGS. 1 and 2, using the reference voltage VREF that sets the common voltage VOS in FIG. 3, performs the feedback control such that the intermediate voltage between the voltage of the output node NQ1 and the voltage of the output node NQ2 of the differential unit 24 is the common voltage VOS. In this way, for example, by setting the reference voltage VREF=1.25 V, the common voltage VOS of the output signals OUT and OUTX can be appropriately set to, for example, 1.25 V determined by a specification of the LVDS.

Specifically, as shown in FIGS. 1 and 2, the feedback control circuit 26 includes a detection resistor RD1 and a detection switch SWD1 provided in series between the output node NQ1 of the differential unit 24 and a detection node ND of the intermediate voltage, and includes a detection resistor RD2 and a detection switch SWD2 provided in series between the output node NQ2 of the differential unit 24 and the detection node ND. The detection resistor RD1 and the detection switch SWD1 are a first detection resistor and a first detection switch, respectively. The detection resistor RD2 and the detection switch SWD2 are a second detection resistor and a second detection switch, respectively. The detection switches SWD1 and SWD2 can be implemented by, for example, transistors of a MOS. The detection switches SWD1 and SWD2 can be implemented by, for example, a transfer gate or the like including the N-type transistor and the P-type transistor.

The feedback control circuit 26 includes an operational amplifier OP that is an amplifier circuit. In the operational amplifier OP, a detection voltage VM in the detection node ND is input to a non-inverting input terminal, and the reference voltage VREF is input to an inverting input terminal. The detection voltage VM corresponds to the intermediate voltage. The non-inverting input terminal is a first input terminal and the inverting input terminal is a second input terminal. Then, the operational amplifier OP outputs the control voltage VC to the gate of the transistor TS of the sink current source ISS.

For example, in the signal output mode in FIG. 1, the detection switches SWD1 and SWD2 of the feedback control circuit 26 are turned on. Then, the detection resistors RD1 and RD2 are set to the same resistance value. Therefore, the detection voltage VM corresponding to the intermediate voltage between the voltage of the output node NQ1 and the voltage of the output node NQ2 of the differential unit 24 is output to the detection node ND.

The detection voltage VM of the detection node ND is input to the non-inverting input terminal of the operational amplifier OP, and the reference voltage VREF set to VREF=1.25 V is input to the inverting input terminal of the operational amplifier OP. Therefore, the control voltage VC is feedback-controlled such that the detection voltage VM corresponding to the intermediate voltage and the reference voltage VREF are equal by the virtual grounding of the operational amplifier OP. For example, when the detection voltage VM corresponding to the intermediate voltage of the output signals OUT and OUTX rises and the detection voltage VM is higher than the reference voltage VREF, the control voltage VC is increased by the feedback control performed by the operational amplifier OP. Accordingly, the on-resistance of the transistor TS is lowered, and the intermediate voltage of the output signals OUT and OUTX is lowered. On the other hand, when the detection voltage VM is lowered and the detection voltage VM is lower than the reference voltage VREF, the control voltage VC is lowered by the feedback control performed by the operational amplifier OP. Accordingly, the on-resistance of the transistor TS is increased, and the intermediate voltage of the output signals OUT and OUTX is increased.

The detection resistors RD1 and RD2, the detection switches SWD1 and SWD2, and the operational amplifier OP that have such configurations are provided, whereby the feedback control can be implemented such that the intermediate voltage between the voltage of the output node NQ1 and the voltage of the output node NQ2 of the differential unit 24 is the common voltage VOS of the output signals OUT and OUTX.

In FIGS. 1 and 2, the LVDS driver circuit 22 includes the switch SW5 provided between the non-inverting input terminal of the operational amplifier OP and the ground node. The switch SW5 is turned off in the signal output mode in FIG. 1 and is turned on in the high impedance mode in FIG. 2. In this way, by turning the switch SW5 on in the high impedance mode, the non-inverting input terminal of the operational amplifier OP is set to the ground voltage. Therefore, in the high impedance mode, a situation can be prevented in which a potential of the non-inverting input terminal of the operational amplifier OP is in an undefined state and an operation is unstable.

Next, the configuration of the differential unit 24 will be described in detail. As shown in FIGS. 1 and 2, the differential unit 24 includes the transistors TA1, TA2, TA3, and TA4, and the switches SW1 to SW4. The transistor TA1 is the P-type transistor that is provided between the current source ISP and the output node NQ2 that is the second output node, and whose gate receives the input signal IN that is the first input signal. The transistor TA2 is the P-type transistor that is provided between the current source ISP and the output node NQ1 that is the first output node, and whose gate receives the input signal INX that is the second input signal. The transistor TA3 is the N-type transistor that is provided between the output node NQ2 and the node N1 that is the first node, and whose gate receives the input signal IN. The transistor TA4 is the N-type transistor that is provided between the output node NQ1 and the node N1, and whose gate receives the input signal INX. The transistors TA1, TA2, TA3, and TA4 are a first transistor, a second transistor, a third transistor, and a fourth transistor, respectively.

According to the differential unit 24 having such a configuration, when the input signal IN is at the H level and the input signal INX is at the L level, the transistors TA2 and TA3 are turned on, so that a current from the current source ISP flows from the transistor TA2 to the transistor TA3 via the external load. Accordingly, the output signal OUT is at the voltage level VOH in FIG. 3, and the output signal OUTX is at the voltage level VOL. Further, when the input signal IN is at the L level and the input signal INX is at the H level, the transistors TA1 and TA4 are turned on, and a current from the current source ISP flows from the transistor TA1 to the transistor TA4 via the external load. Accordingly, the output signal OUT is at the voltage level VOL, and the output signal OUTX is at the voltage level VOH. As described above, according to the differential unit 24 having the configurations in FIGS. 1 and 2, the output signals OUT and OUTX that constitute the differential output signal of the LVDS as shown in FIG. 3 can be appropriately output in accordance with the input signals IN and INX that constitute the differential input signal.

The differential unit 24 includes the switches SW1, SW2, SW3, and SW4. The switches SW1, SW2, SW3, and SW4 are a first switch, a second switch, a third switch, and a fourth switch, respectively. For example, the switches SW1 and SW2 can be implemented by the P-type transistors, and the switches SW3 and SW4 can be implemented by the N-type transistors.

The switch SW1 is provided in series with the transistor TA1 and between the current source ISP and the output node NQ2. For example, one end of the switch SW1 is coupled to the node N2, and the other end of the switch SW1 is coupled to a source of the transistor TA1. The switch SW2 is provided in series with the transistor TA2 and between the current source ISP and the output node NQ1. For example, one end of the switch SW2 is coupled to the node N2, and the other end of the switch SW2 is coupled to a source of the transistor TA2. The switch SW3 is provided in series with the transistor TA3 and between the output node NQ2 and the node N1. For example, one end of the switch SW3 is coupled to a source of the transistor TA3, and the other end of the switch SW3 is coupled to the node N1. The switch SW4 is provided in series with the transistor TA4 and between the output node NQ1 and the node N1. For example, one end of the switch SW4 is coupled to a source of the transistor TA4, and the other end of the switch SW4 is coupled to the node N1.

In FIGS. 1 and 2, the switches SW1 and SW2 are provided on a side of the current source ISP, and the transistors TA1 and TA2 are provided on a side of the output nodes NQ2 and NQ1. However, the switches SW1 and SW2 may be provided on the side of the output nodes NQ2 and NQ1, and the transistors TA1 and TA2 may be provided on the side of the current source ISP. Further, the switches SW3 and SW4 are provided on a side of the node N1, and the transistors TA3 and TA4 are provided on the side of the output nodes NQ2 and NQ1. However, the switches SW3 and SW4 may be provided on the side of the output nodes NQ2 and NQ1, and the transistors TA1 and TA2 may be provided on the side of the node N1.

When such switches SW1, SW2, SW3, and SW4 are provided, for example, in the signal output mode in FIG. 1, the switches SW1, SW2, SW3, and SW4 are turned on, so that the current source ISP and the transistors TA1 and TA2 are electrically coupled to one another, and the transistors TA3 and TA4 and the sink current source ISS are electrically coupled to one another. Accordingly, signal transmission of the LVDS as shown in FIG. 3 may be performed. On the other hand, in the high impedance mode in FIG. 2, SW1, SW2, SW3, and SW4 are turned off, so that the current source ISP and the output nodes NQ1 and NQ2 are not electrically coupled to one another, and the output nodes NQ1 and NQ2 and the sink current source ISS are not electrically coupled to one another. Accordingly, the output nodes NQ1 and NQ2 of the differential unit 24 are in the high impedance state, and the high impedance mode can be implemented. Further, when the switches SW1, SW2, SW3, and SW4 are turned off, a current from the current source ISP does not flow to the external load, and a current from the external load also does not flow to the sink current source ISS, so that power saving in the high impedance mode can be implemented. Further, when the LVDS driver circuit 22 is in the output high impedance state, other driver circuits such as the PECL, the HCSL, or the differential CMOS, which are provided in the output driver 46 and to be described below with reference to FIGS. 12 to 15, may be appropriately operated.

In the present embodiment, in the high impedance mode in FIG. 2, the transistor TA2 and the transistor TA3 are turned on, and the transistor TA1 and the transistor TA4 are turned off. In this way, in the high impedance mode, the output node NQ1 of the differential unit 24 is set at the H level that is the voltage level of the VDD, and the output node NQ2 is set at the L level that is a voltage level of the GND. Therefore, for example, when switching the mode from the high impedance mode to the signal output mode, the signal output can be started in a state where the output signal OUT is at the H level and the output signal OUTX is at the L level, and a situation where the signal output is unstable can be prevented.

In the high impedance mode, the transistor TA1 and the transistor TA4 may be turned on, and the transistor TA2 and the transistor TA3 may be turned off. In this way, in the high impedance mode, the output node NQ1 of the differential unit 24 is set at the L level, and the output node NQ2 is set at the H level. Therefore, for example, when switching the mode from the high impedance mode to the signal output mode, the signal output can be started in a state where the output signal OUT is at the L level and the output signal OUTX is at the H level.

Figure 4:
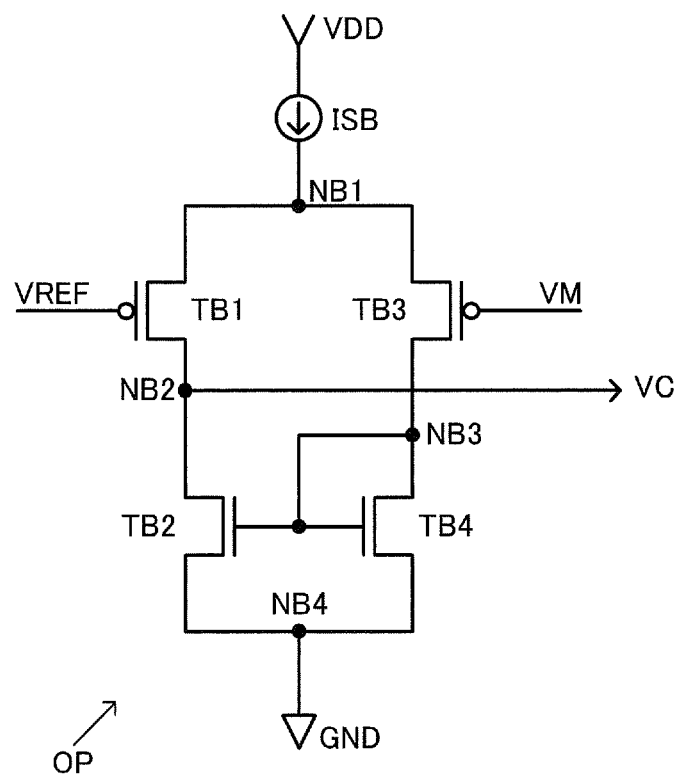
FIG. 4 shows a configuration example of an operational amplifier.

Next, the configuration of the operational amplifier OP will be described in detail. FIG. 4 shows a configuration example of the operational amplifier OP. The operational amplifier OP includes a current source ISB and transistors TB1, TB2, TB3, and TB4. The current source ISB is provided between the node of the VDD and a node NB1. The P-type transistor TB1 is provided between the node NB1 and a node NB2 from which the control voltage VC is output. The reference voltage VREF is input to a gate. The N-type transistor TB2 is provided between the node NB2 and a node NB4 that is a ground node. The P-type transistor TB3 is provided between the node NB1 and a node NB3. The detection voltage VM is input to a gate. The N-type transistor TB4 is provided between the node NB3 and the node NB4. Gates of the transistors TB2 and TB4 are coupled to the node NB3, and are coupled to a current mirror.

Next, a detailed operation of the present embodiment will be described. First, an LVDS driver circuit 122 of a comparative example of the present embodiment will be described with reference to FIGS. 5 and 6. In the LVDS driver circuit 122 of the comparative example in FIG. 5, the switches SWA and SW5 in FIGS. 1 and 2 are not provided. Therefore, an overshoot occurs after switching a mode from a high impedance mode to a signal output mode. For example, FIG. 6 is a signal waveform example illustrating an operation of the LVDS driver circuit 122 of the comparative example. A signal MDSW is a mode switching signal. When the signal MDSW is at the L level, the high impedance mode is set, and when the signal MDSW is at the H level, the signal output mode is set. Then, as indicated by A1 of FIG. 6, the signal MDSW is changed from the L level to the H level, so that the mode is switched from the high impedance mode to the signal output mode.

Figure 5:
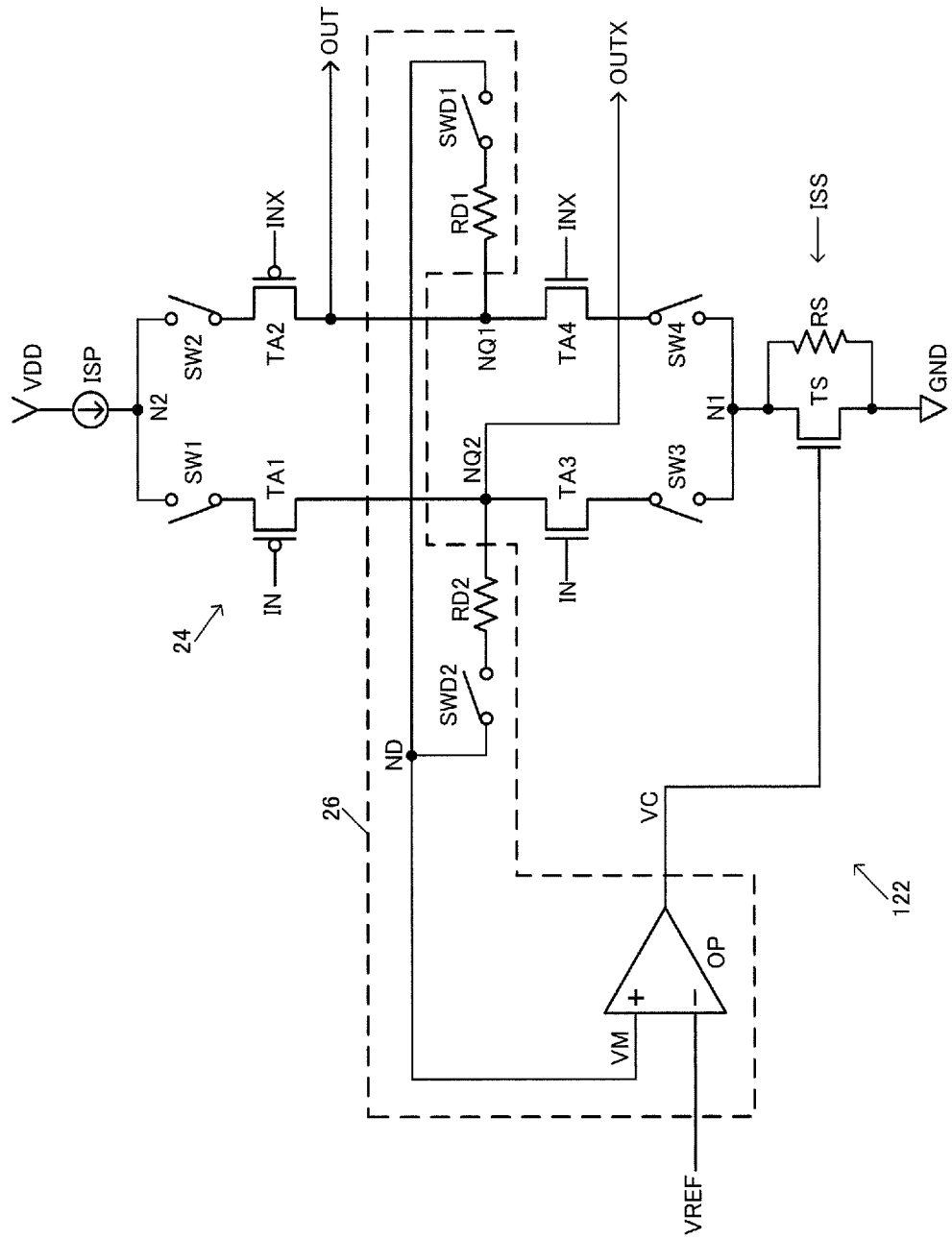
FIG. 5 is an explanatory diagram of a configuration example of an LVDS driver circuit of a comparative example.

When the signal MDSW is at the L level and the LVDS driver circuit 122 is set to the high impedance mode, the switches SW1, SW2, SW3, SW4, SWD1, and SWD2 are turned off as shown in FIG. 5. Then, for example, a potential of a non-inverting input terminal of the operational amplifier OP is at an undefined level, and the control voltage VC output from the operational amplifier OP is a voltage near 0 V as indicated by A2 of FIG. 6. Then, when the control voltage VC is the voltage near 0 V as described above, the transistor TS of the sink current source ISS is turned off. In this state, as indicated by A1, when the signal MDSW is changed from the L level to the H level and the mode is switched from the high impedance mode to the signal output mode, feedback control performed by the feedback control circuit 26 does not work immediately, and as indicated by A3, the control voltage VC is gradually increased from the voltage near 0 V. During a period until a timing when the control voltage VC exceeds a threshold voltage of the transistor TS, since the transistor TS is turned off and a sufficient current does not flow to a side of the sink current source ISS, the overshoot as indicated by A4 occurs. For example, when a current does not sufficiently flow to the side of the sink current source ISS, voltage levels of the output signals OUT and OUTX are raised to a voltage level on a high potential side by the P-type transistors TA1 and TA2 and the like. The overshoot causes a problem such as the voltage levels of the output signals OUT and OUTX jumping up to, for example, near a voltage level of the VDD, and exceeding a maximum rating of an integrated circuit device on an reception side. When the control voltage VC exceeds the threshold voltage of the transistor TS and the feedback control performed by the feedback control circuit 26 works normally, the output signals OUT and OUTX are in a signal state as indicated by A5, and appropriate signal transmission of the LVDS is performed.

FIG. 7 is a signal waveform example illustrating an operation of the LVDS driver circuit 22 in the present embodiment. As indicated by B1 of FIG. 7, when the signal MDSW, which is the mode switching signal, is changed from the L level to the H level, the mode is switched from the high impedance mode to the signal output mode. Here, the signal MDSW is output by, for example, the control circuit 50 in FIG. 11 to be described below. More specifically, the control circuit 50 outputs, based on the signal MDSW, a switch signal to the switches SW1, SW2, SW3, SW4, SWD1, SWD2, SWA, and SW5, and controls ON and OFF of these switches. When the signal MDSW is at the L level and the LVDS driver circuit 22 is set to the high impedance mode, the switches SW1, SW2, SW3, and SW4 are turned off as shown in FIG. 2, and the output nodes NQ1 and NQ2 of the differential unit 24 are in the high impedance state. Further, the detection switches SWD1 and SWD2 of the feedback control circuit 26 are turned off, and the detection voltage VM is not detected. When the switch SW5 is turned on, the non-inverting input terminal of the operational amplifier OP is set to 0 V that is the ground voltage, and the potential of the non-inverting input terminal of the operational amplifier OP is prevented from being in an undefined state.

In the present embodiment, the switch SWA is turned on as shown in FIG. 2 in the high impedance mode. Accordingly, as indicated by B2 of FIG. 7, the output node NC of the control voltage VC is set at the voltage level of the VDD. Therefore, the transistor TS is turned on, and a sufficient current flows to the sink current source ISS.

Next, as indicated by B1, when the signal MDSW is changed from the L level to the H level, and the mode is switched from the high impedance mode to the signal output mode, the control voltage VC is gradually lowered as indicated by B3. Then, since the threshold voltage of the transistor TS is, for example, about 0.4 V and the control voltage VC exceeds the threshold voltage, a sufficient current flows to the sink current source ISS. Therefore, even after the mode is switched from the high impedance mode to the signal output mode, the overshoot of A4 of FIG. 6 does not occur as indicated by B4. Thereafter, when the feedback control of the feedback control circuit 26 works normally, the output signals OUT and OUTX are in a signal state as indicated by B5, and the appropriate signal transmission of the LVDS described in FIG. 3 is performed. Specifically, in the signal output mode, as shown in FIG. 1, the switches SW1, SW2, SW3, and SW4 are turned on, and the output signals OUT and OUTX can be output from the differential unit 24. Further, when the detection switches SWD1 and SWD2 are turned on, the intermediate voltage of the output signals OUT and OUTX is monitored as the detection voltage VM, and the feedback control performed by the feedback control circuit 26 is performed. Further, the switches SWA and SW5 are turned off.

3. Other Configuration Examples

Figure 8:
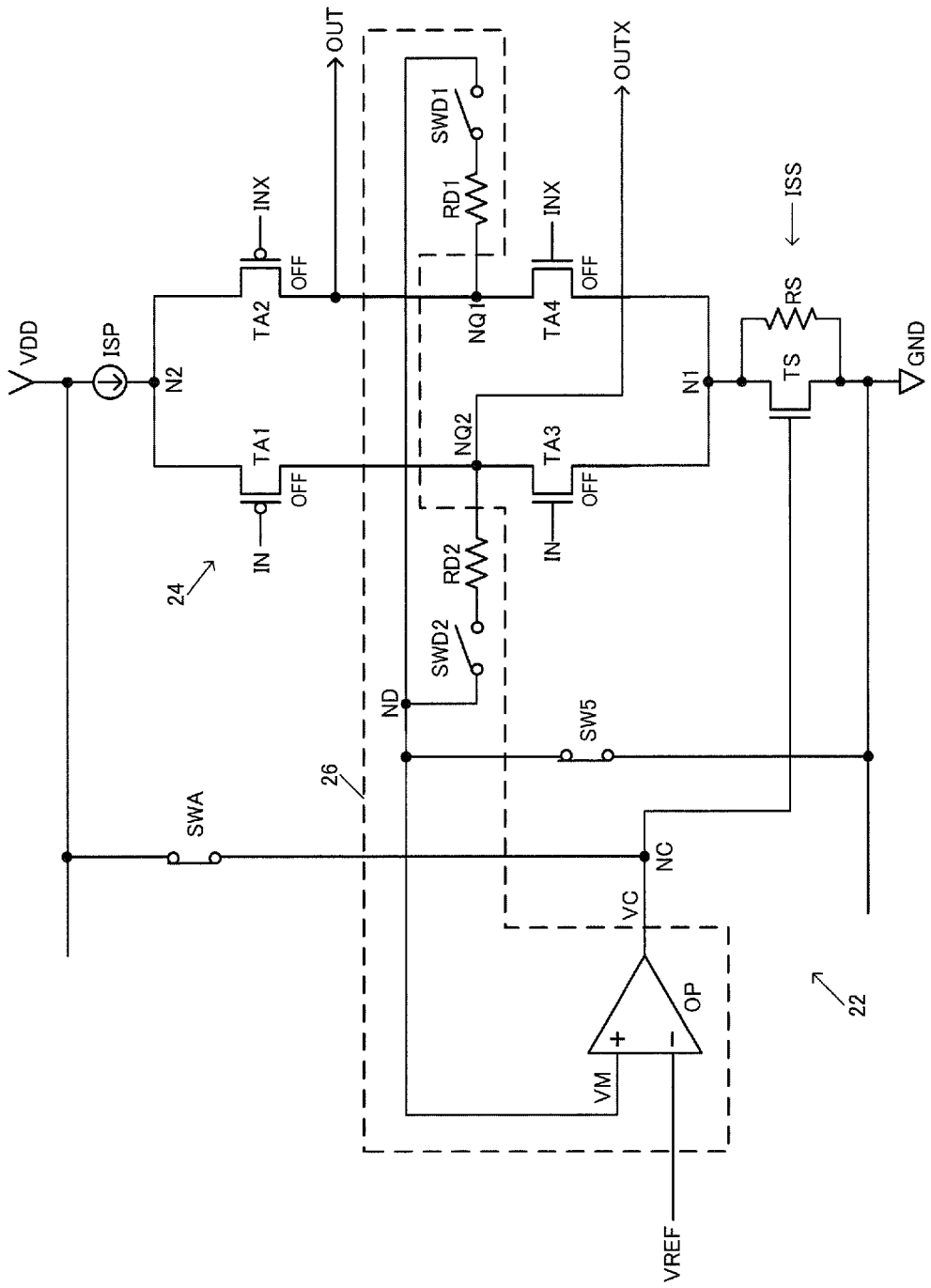
FIG. 8 is an explanatory diagram of a second configuration example of the LVDS driver circuit.

Next, other configuration examples of the present embodiment will be described. FIG. 8 shows a second configuration example of the LVDS driver circuit 22. In the second configuration example of FIG. 8, the switches SW1, SW2, SW3, and SW4 of the first configuration example of FIGS. 1 and 2 are not provided. That is, the differential unit 24 only includes the transistors TA1, TA2, TA3, and TA4. In a high impedance mode, the transistors TA1, TA2, TA3, and TA4 are turned off as shown in FIG. 8. Accordingly, the output nodes NQ1 and NQ2 of the differential unit 24 are in a high impedance state, and the high impedance mode is implemented. Further, in the high impedance mode, similar to the case of FIGS. 1 and 2, the switch SWA is turned on and occurrence of an overshoot is prevented. In the high impedance mode, similar to the case of FIGS. 1 and 2, the detection switches SWD1 and SWD2 are turned off, and the switch SW5 is turned on. On the other hand, in a signal output mode, the detection switches SWD1 and SWD2 are turned on, feedback control performed by the feedback control circuit 26 is performed, and the switches SWA and SW5 are turned off.

Figure 9:
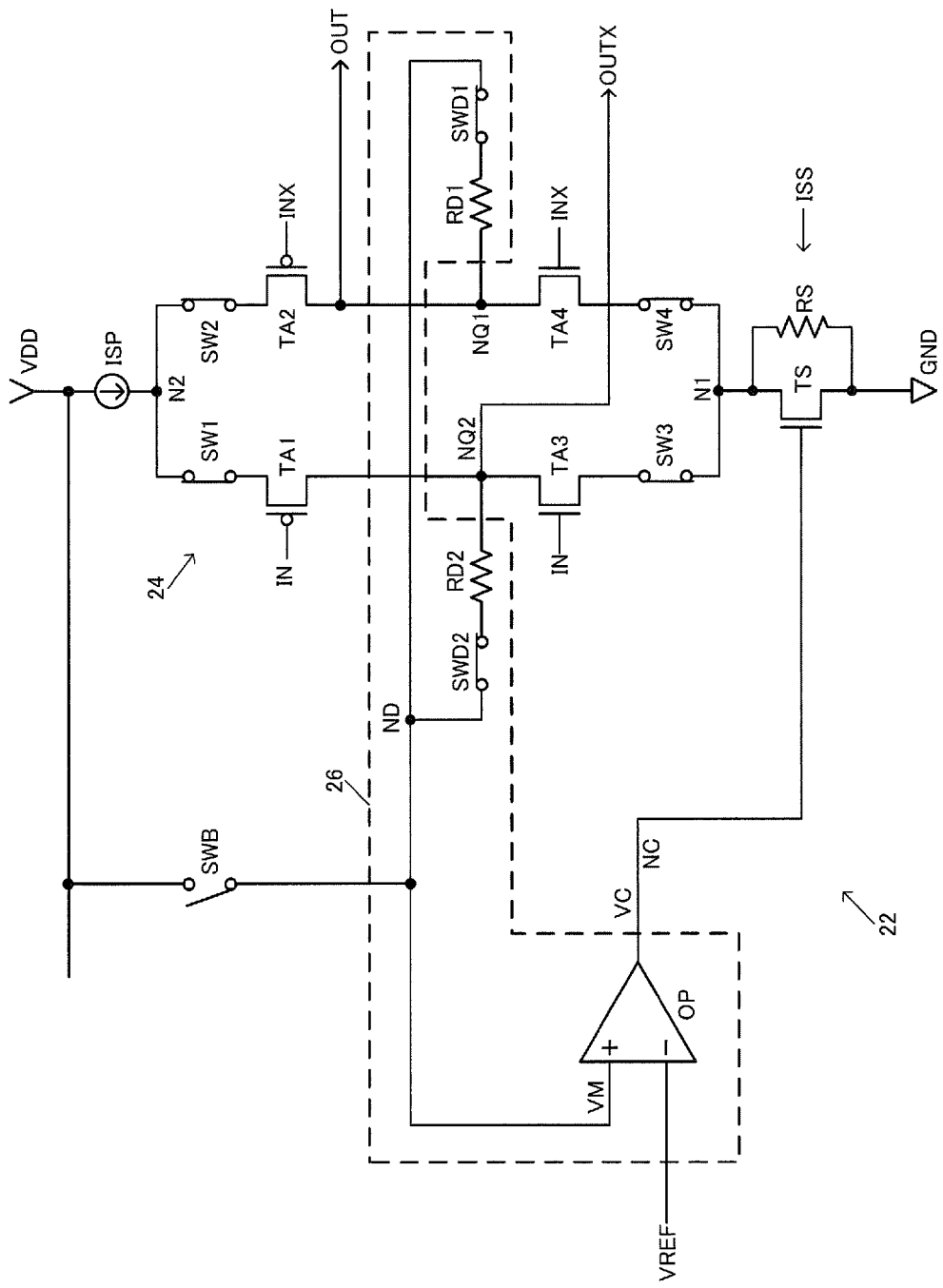
FIG. 9 is an explanatory diagram of a signal output mode of a third configuration example of the LVDS driver circuit.
Figure 10:
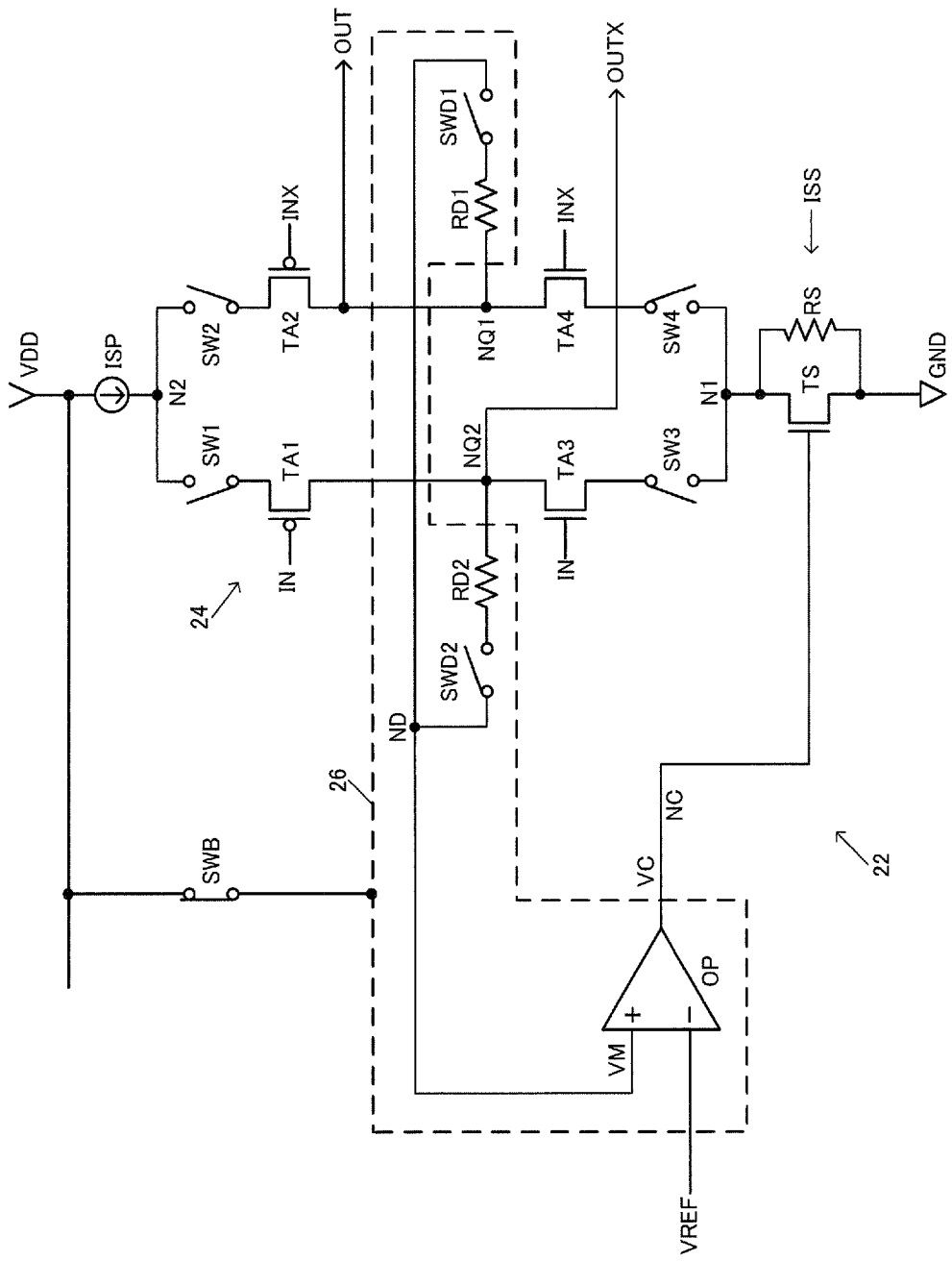
FIG. 10 is an explanatory diagram of a high impedance mode of the third configuration example of the LVDS driver circuit.

FIGS. 9 and 10 show a third configuration example of the LVDS driver circuit 22. FIG. 9 shows a state in a signal output mode, and FIG. 10 shows a state in a high impedance mode.

In the third configuration example of FIGS. 9 and 10, the feedback control circuit 26 includes, similar to the case of FIGS. 1 and 2, the operational amplifier OP that outputs the control voltage VC. Specifically, the feedback control circuit 26, using the reference voltage VREF that sets the common voltage VOS, performs feedback control so that an intermediate voltage between a voltage of the output node NQ1 and a voltage of the output node NQ2 of the differential unit 24 is the common voltage VOS. The operational amplifier OP is provided in the feedback control circuit 26. The detection voltage VM corresponding to the intermediate voltage is input to a non-inverting input terminal of the operational amplifier OP, and the reference voltage VREF is input to an inverting input terminal of the operational amplifier OP. In this way, the feedback control that makes the intermediate voltage, which is between the voltage of the output node NQ1 and the voltage of the output node NQ2 of the differential unit 24, the common voltage VOS of a differential output signal can be implemented using virtual grounding of the operational amplifier OP.

The LVDS driver circuit 22 includes a switch SWB provided between a power supply node and the non-inverting input terminal of the operational amplifier OP. Specifically, one end of the switch SWB is coupled to the power supply node of a VDD, and the other end of the switch SWB is coupled to the detection node ND to which the non-inverting input terminal of the operational amplifier OP is coupled. Then, the switch SWB is turned off in the signal output mode as shown in FIG. 9 and is turned on in the high impedance mode as shown in FIG. 10.

In this way, when the switch SWB is turned on in the high impedance mode, the non-inverting input terminal of the operational amplifier OP is set at a power supply voltage level of the VDD. Accordingly, the control voltage VC output from the operational amplifier OP is also set at, similar to the case indicated by B2 of FIG. 7, the power supply voltage level of the VDD. Then, when the mode is switched from the high impedance mode to the signal output mode, similar to the case indicated by B3 of FIG. 7, the control voltage VC is gradually lowered. At this time, since the control voltage VC exceeds a threshold voltage of the transistor TS, a sufficient current flows to the sink current source ISS, and the overshoot does not occur, which is similar to the case of B4.

Since control modes of ON and OFF of the switches SW1 to SW4, SWD1, and SWD2 in the high impedance mode or the signal output mode, and operations of the differential unit 24 and the feedback control circuit 26 in the third configuration example of FIGS. 9 and 10 are similar to those in the first configuration example of FIGS. 1 and 2, detailed description thereof will be omitted. Further, also in the third configuration example of FIGS. 9 and 10, the high impedance mode may be implemented by omitting the configurations of the switches SW1 to SW4 as in the second configuration example of FIG. 8 and turning off the transistors TA1 to TA4.

4. Integrated Circuit Device

Figure 11:
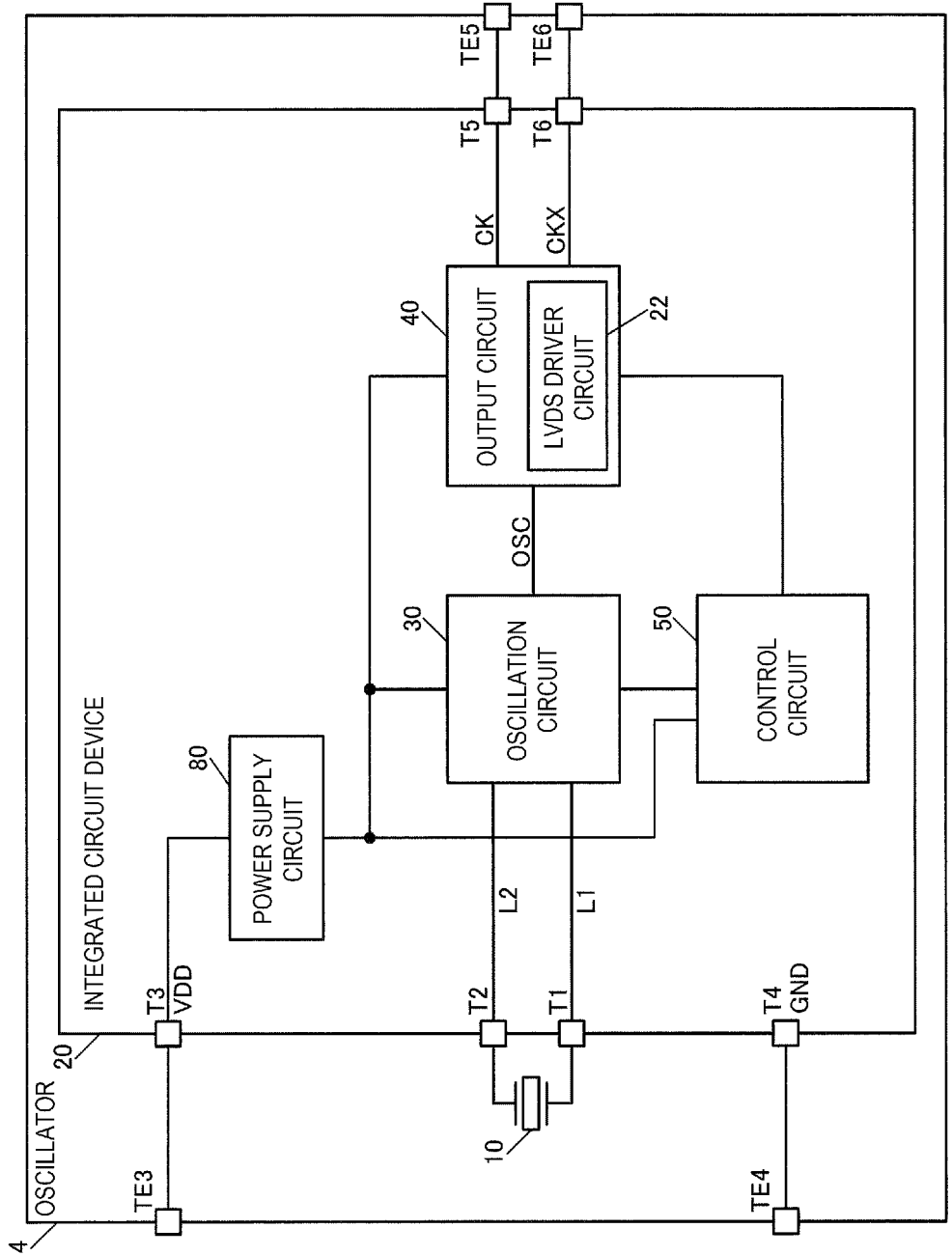
FIG. 11 shows a configuration example of an integrated circuit device according to the present embodiment.

FIG. 11 shows a configuration example of an integrated circuit device 20 including the LVDS driver circuit 22 in the present embodiment. The integrated circuit device 20 includes an oscillation circuit 30 and an output circuit 40. Further, an oscillator 4 in the present embodiment includes a vibrator 10 and the integrated circuit device 20. The vibrator 10 is electrically coupled to the integrated circuit device 20. For example, the vibrator 10 and the integrated circuit device 20 are electrically coupled to each other by using internal wiring of a package that houses the vibrator 10 and the integrated circuit device 20, a bonding wire, a metal bump, or the like.

The vibrator 10 is an element that generates a mechanical vibration in accordance with an electric signal. The vibrator 10 can be implemented by, for example, a vibrator element such as a crystal vibrator element. For example, the vibrator 10 can be implemented by a crystal vibrator element or the like that performs a thickness-shear vibration and whose cut angle is AT-cut, SC-cut or the like. For example, the vibrator 10 may be a vibrator built in a temperature compensated crystal oscillator (TCXO) that does not include an oven, or may be a vibrator built in an oven-controlled crystal oscillator (OCXO) including the oven. The vibrator 10 in the present embodiment can be implemented by, for example, various vibrator elements such as a vibrator element other than the thickness-shear vibration type or a piezoelectric vibrator element formed of a material other than a crystal. For example, as the vibrator 10, a surface acoustic wave (SAW) resonator, a micro electro mechanical systems (MEMS) vibrator serving as a silicon vibrator formed using a silicon substrate, or the like may be adopted.

The integrated circuit device 20 is a circuit device referred to as an integrated circuit (IC). For example, the integrated circuit device 20 is an IC manufactured by a semiconductor process, and is a semiconductor chip in which a circuit element is formed at a semiconductor substrate.

The integrated circuit device 20 includes the oscillation circuit 30 and the output circuit 40. Further, the integrated circuit device 20 can include terminals T1, T2, T3, T4, T5, and T6, the control circuit 50, and a power supply circuit 80. The terminals T1, T2, T3, T4, T5, and T6 are, for example, pads of the integrated circuit device 20.

The terminal T1 is electrically coupled to one end of the vibrator 10, and the terminal T2 is electrically coupled to the other end of the vibrator 10. For example, the vibrator 10 and the terminals T1 and T2 of the integrated circuit device 20 are electrically coupled using the internal wiring of the package that houses the vibrator 10 and the integrated circuit device 20, the bonding wire, the metal bump, or the like. The terminals T1 and T2 are electrically coupled to the oscillation circuit 30 via signal lines L1 and L2.

The terminal T3 is a terminal to which the power supply voltage VDD is supplied. For example, the power supply voltage VDD is supplied from an external power supply device to the terminal T3. The terminal T4 is a terminal to which the GND that is the ground voltage is supplied. The terminals T5 and T6 are terminals to which clock signals CK and CKX generated based on an oscillation signal OSC of the oscillation circuit 30 are output. The clock signals CK and CKX are a first output clock signal and a second output clock signal that constitute the differential output clock signal.

The terminals T3, T4, T5, and T6 are electrically coupled to external terminals TE3, TE4, TE5, and TE6 for external coupling of the oscillator 4, respectively. For example, the electric coupling is performed using the internal wiring of the package, the bonding wire, the metal bump, or the like. The external terminals TE3, TE4, TE5, and TE6 of the oscillator 4 are electrically coupled to an external device.

The oscillation circuit 30 is a circuit that causes the vibrator 10 to oscillate. For example, the oscillation circuit 30 is electrically coupled to the terminals T1 and T2, and generates the oscillation signal OSC by causing the vibrator 10 to oscillate. For example, the oscillation circuit 30 drives the vibrator 10 via the signal lines L1 and L2 coupled to the terminals T1 and T2, and causes the vibrator 10 to oscillate. For example, the oscillation circuit 30 includes a drive circuit for oscillation provided between the terminals T1 and T2, or the like. For example, the oscillation circuit 30 can be implemented by a transistor such as a bipolar transistor that implements the drive circuit, and a passive element such as a capacitor or a resistor. The drive circuit is a core circuit of the oscillation circuit 30, and causes the vibrator 10 to oscillate by driving the vibrator 10 with a current or a voltage. As the oscillation circuit 30, for example, various types of oscillation circuits can be used such as a pierce type, a Colpitts type, an inverter type, and a Hartley type. Further, the oscillation circuit 30 may be provided with a variable capacitance circuit. An oscillation frequency may be adjusted by adjusting a capacitance of the variable capacitance circuit. The variable capacitance circuit can be implemented by a variable capacitance element such as a varactor. The variable capacitance circuit is electrically coupled to, for example, the signal line L1 to which the terminal T1 is coupled. The oscillation circuit 30 may include a first variable capacitance circuit electrically coupled to the signal line L1 to which the terminal T1 is coupled, and a second variable capacitance circuit electrically coupled to the signal line L2 to which the terminal T2 is coupled. It should be noted that "couple" in the present embodiment means "being electrically coupled". The "being electrically coupled" means that the coupling is performed such that an electric signal can be transmitted and information can be transmitted by the electric signal. The "being electrically coupled" may mean that the coupling is performed via the active element or the like.

The output circuit 40 outputs the clock signals CK and CKX based on the oscillation signal OSC from the oscillation circuit 30. For example, the output circuit 40 buffers the oscillation signal OSC from the oscillation circuit 30 and outputs the clock signals CK and CKX. For example, the output circuit 40 can perform waveform shaping of the oscillation signal OSC, level shift of a voltage level, and the like. The output circuit 40 can output the clock signals CK and CKX to outside, for example, in various signal formats. For example, the output circuit 40 outputs the clock signals CK and CKX to the outside in signal formats such as the low voltage differential signaling (LVDS), the positive emitter coupled logic (PECL), the high speed current steering logic (HCSL), the differential CMOS (Complementary MOS), and the like. For example, the output circuit 40 may be a circuit configured to output the clock signals in at least two signal formats of the LVDS, the PECL, the HCSL, and the differential CMOS. In this case, the output circuit 40 outputs the clock signals in the signal formats set by the control circuit 50.

The control circuit 50 performs various control processings. For example, the control circuit 50 controls the entire integrated circuit device 20. For example, the control circuit 50 controls an operation sequence of the integrated circuit device 20. Further, the control circuit 50 performs various processings of controlling the oscillation circuit 30. The control circuit 50 can also control the output circuit 40 and the power supply circuit 80. The control circuit 50 performs a temperature compensation processing on the oscillation frequency of the oscillation circuit 30. The control circuit 50 can be implemented by, for example, a circuit of an application specific integrated circuit (ASIC) by automatic arrangement and wiring such as a gate array.

The power supply circuit 80 is supplied with the power supply voltage VDD from the terminal T3 and supplies various power supply voltages for an internal circuit of the integrated circuit device 20 to the internal circuit. For example, the power supply voltage VDD itself is supplied, or a power supply voltage obtained by regulating the external power supply voltage VDD is supplied. The integrated circuit device 20 may not have a temperature compensation function. In this case, the oscillator 4 is an oscillator of a simple packaged crystal oscillator (SPXO).

In the integrated circuit device 20 of FIG. 11, the output circuit 40 includes the LVDS driver circuit 22 in the present embodiment. Then, the output circuit 40 outputs, based on the oscillation signal OSC, the clock signal CK as the output signal OUT and the clock signal CKX as the output signal OUTX. The clock signal CK is a first output clock signal, and the clock signal CKX is a second output clock signal.

Figure 12:
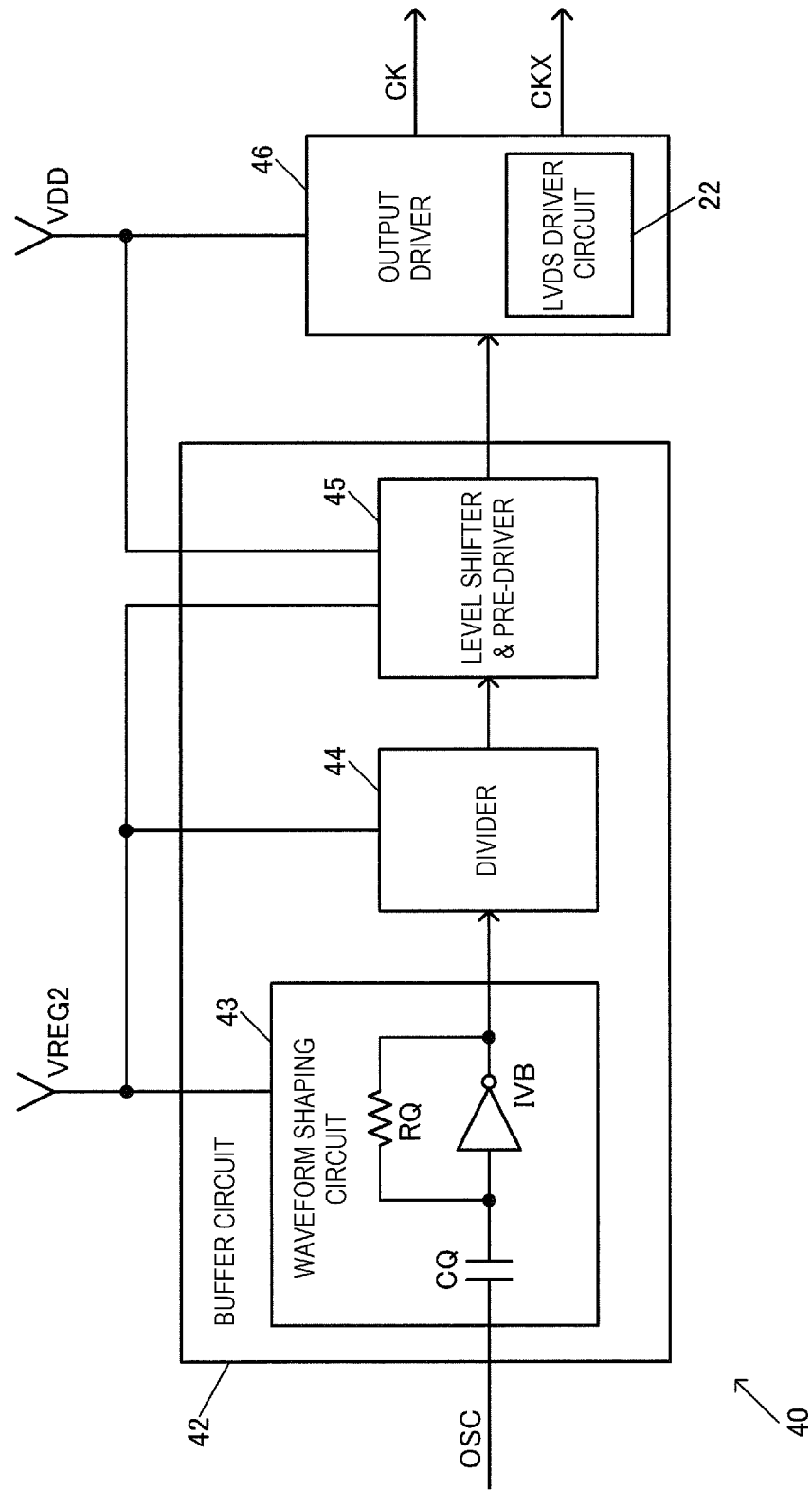
FIG. 12 shows a configuration example of an output circuit.

For example, FIG. 12 shows a configuration example of the output circuit 40. The output circuit 40 includes a buffer circuit 42 that performs buffering and the like on the oscillation signal OSC, and an output driver 46 that outputs and drives the clock signals CK and CKX based on the oscillation signal OSC. The buffer circuit 42 can include, for example, a waveform shaping circuit 43, a divider 44, and a level shifter & pre-driver 45. The waveform shaping circuit 43 is a circuit that performs waveform shaping of the oscillation signal OSC and outputs a signal of a rectangular wave corresponding to the oscillation signal OSC. The waveform shaping circuit 43 includes an inverter IVB, and a feedback resistor RQ provided between an output terminal and an input terminal of the inverter IVB. The divider 44 is a circuit that performs clock division. The clock signals CK and CKX having a frequency obtained by dividing a frequency of the oscillation signal OSC can be output by providing the divider 44. The level shifter & pre-driver 45 is a circuit that performs level shift from a power supply voltage level of VREG2 to the power supply voltage level of the VDD and performs a pre-drive that drives the output driver 46. For example, a regulation power supply voltage VREG2 is supplied to the waveform shaping circuit 43 and the divider 44 of the buffer circuit 42, and the regulation power supply voltage VREG2 and the power supply voltage VDD are supplied to the level shifter & pre-driver 45. On the other hand, the power supply voltage VDD is supplied to the output driver 46. The VREG2 is a regulation power supply voltage that satisfies VDD>VREG2, and is generated by a regulator provided in the power supply circuit 80.

The output driver 46 includes the LVDS driver circuit 22. Further, the output driver 46 can include at least one driver circuit of a driver circuit of the PECL, a driver circuit of the HCSL, and a driver circuit of the differential CMOS. When a plurality of driver circuits are provided in the output driver 46, a part of transistors that constitute the plurality of driver circuits may be shared among the plurality of driver circuits.

Figure 13:
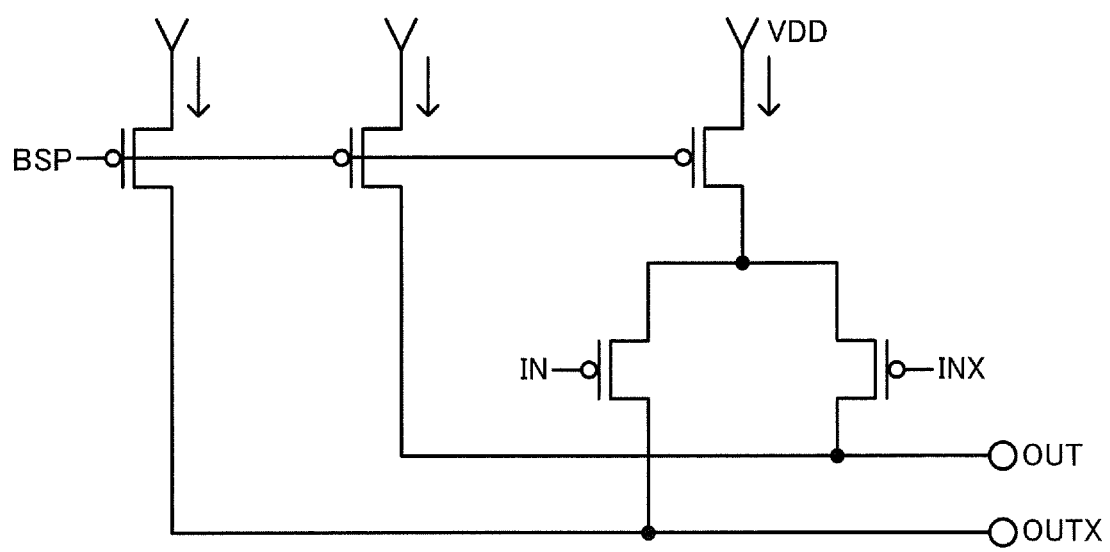
FIG. 13 is an explanatory diagram of a driver circuit of PECL.

FIG. 13 shows a configuration example of the driver circuit of the PECL. The driver circuit includes, for example, a P-type transistor that causes a driving current of 15.25 mA to flow, two P-type transistors that constitute the differential unit, and two P-type transistors that constitute a bias current circuit that causes a bias current of 5.7 mA to flow to nodes of the output signals OUT and OUTX. The driver circuit is actually referred to as low voltage positive emitter coupled logic (LV-PECL), but is simply referred to as the PECL in the present embodiment. A differential output signal of the PECL is a signal having an amplitude such that a voltage on the high potential side is the VOH and a voltage on the low potential side is the VOL. The VOH is, for example, a voltage of 0.9525 V on a negative potential side with reference to the VDD, and the VOL is, for example, a voltage of 1.715 V on the negative potential side with reference to the VDD. In the PECL, a Thevenin termination, a y termination, or the like is performed on the reception side.

Figure 14:
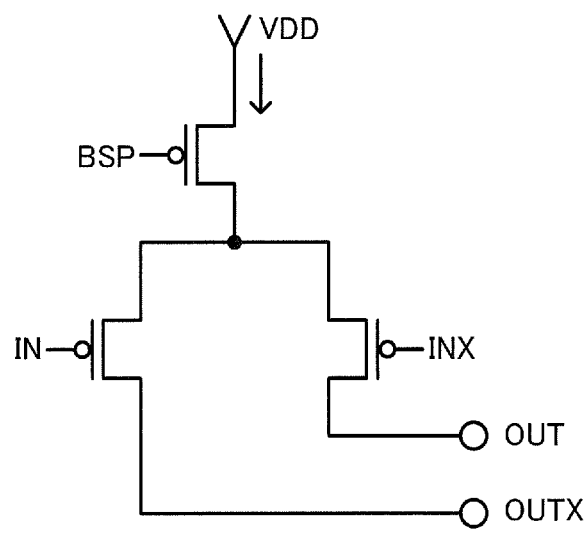
FIG. 14 is an explanatory diagram of a driver circuit of HCSL.
Figure 15:
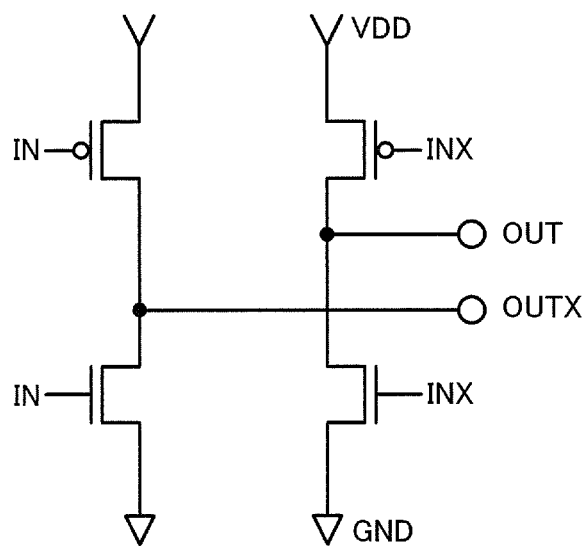
FIG. 15 is an explanatory diagram of a driver circuit of a CMOS.

FIG. 14 shows a configuration example of the driver circuit of the HCSL. The driver circuit includes, for example, a P-type transistor that causes a driving current of 15 mA to flow, and two P-type transistors that constitute the differential unit. A differential output signal of the HCSL is, for example, a signal having an amplitude of 1.15 V or less with 0.4 V as a center voltage. FIG. 15 shows a configuration example of the driver circuit of the differential CMOS. The driver circuit includes a P-type transistor and an N-type transistor that are provided in series between the VDD and the GND and whose gates receive the input signal IN, and includes a P-type transistor and an N-type transistor that are provided in series between the VDD and the GND and whose gate receives the input signal INX. A differential output signal of the driver circuit of the CMOS is a full swing signal in a voltage range from the VDD to the GND.

5. Oscillator

Figure 16:
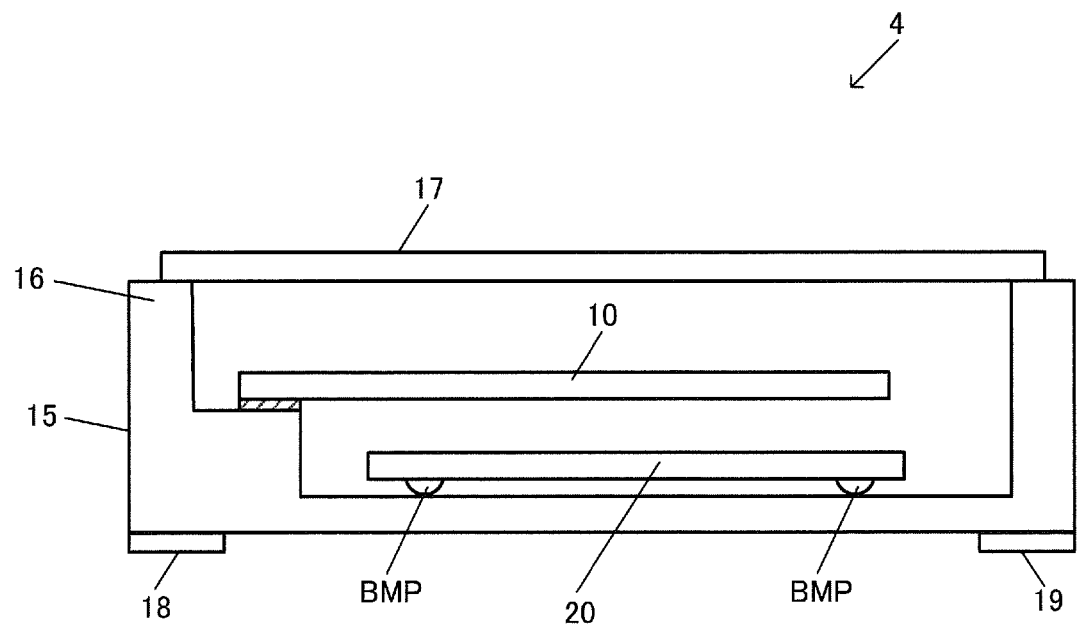
FIG. 16 shows a first structure example of an oscillator.

Next, a structure example of the oscillator 4 in the present embodiment will be described. FIG. 16 shows a first structure example of the oscillator 4. The oscillator 4 includes the vibrator 10, the integrated circuit device 20, and a package 15 that houses the vibrator 10 and the integrated circuit device 20. The package 15 is formed of, for example, ceramic and has a housing space therein. The vibrator 10 and the integrated circuit device 20 are housed in the housing space. The housing space is hermetically sealed and is preferably in a reduced-pressure state that is a state close to vacuum. The package 15 can suitably protect the vibrator 10 and the integrated circuit device 20 from an impact, dust, heat, moisture, and the like.

The package 15 includes a base 16 and a lid 17. Specifically, the package 15 includes the base 16 that supports the vibrator 10 and the integrated circuit device 20, and the lid 17 bonded to an upper surface of the base 16 to form the housing space between the base 16 and the lid 17. Then, the vibrator 10 is supported, via a terminal electrode, by a stepped portion provided in the base 16. Further, the integrated circuit device 20 is disposed on an inner bottom surface of the base 16. Specifically, the integrated circuit device 20 is disposed such that an active surface of the integrated circuit device 20 faces the inner bottom surface of the base 16. The active surface is a surface at which the circuit element of the integrated circuit device 20 is formed. Further, bumps BMP are formed at pads of the integrated circuit device 20. The integrated circuit device 20 is supported on the inner bottom surface of the base 16 via the conductive bumps BMP. The conductive bump BMP is, for example, a metal bump. The vibrator 10 and the integrated circuit device 20 are electrically coupled to each other via the bumps BMP, internal wiring of the package 15, the terminal electrode, and the like. Further, the integrated circuit device 20 is electrically coupled, via the bumps BMP and the internal wiring of the package 15, to external terminals 18 and 19 of the oscillator 4. The external terminals 18 and 19 are formed at an outer bottom surface of the package 15. The external terminals 18 and 19 are coupled, via external wiring, to the external device. The external wiring is, for example, wiring formed at a circuit board on which the external device is mounted. Accordingly, the clock signals or the like can be output to the external device.

Although the integrated circuit device 20 is flip-mounted such that the active surface of the integrated circuit device 20 faces downward in FIG. 16, the present embodiment is not limited to such mounting. For example, the integrated circuit device 20 may be mounted such that the active surface of the integrated circuit device 20 faces upward. That is, the integrated circuit device 20 is mounted such that the active surface faces the vibrator 10.

Figure 17:
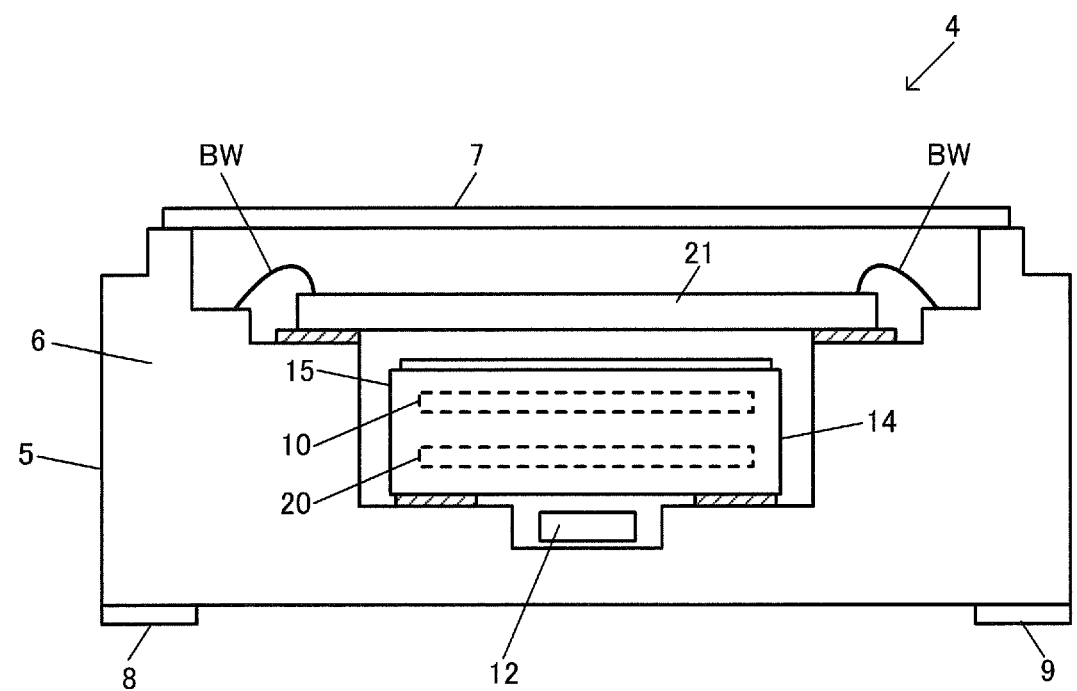
FIG. 17 shows a second structure example of the oscillator.

FIG. 17 shows a second structure example of the oscillator 4. The oscillator 4 in FIG. 17 includes the vibrator 10, the integrated circuit device 20, and an integrated circuit device 21. Further, the oscillator 4 includes the package 15 that houses the vibrator 10 and the integrated circuit device 20, and a package 5 that houses the package 15 and the integrated circuit device 21. The package 15 and the package 5 are a first package and a second package, respectively. The first package and the second package can also be referred to as a first container and a second container.

In the present embodiment, the integrated circuit device 20 housed in the package 15 performs a first temperature compensation processing, and the integrated circuit device 21 housed in the package 5 performs a second temperature compensation processing. For example, when the vibrator 10 and the integrated circuit device 20 are housed in the package 15, a temperature compensated oscillator 14 is formed which performs, for example, the analog first temperature compensation processing. Then, when the oscillator 14 that performs the analog first temperature compensation processing and the integrated circuit device 21 that performs the digital second temperature compensation processing are housed in the package 5, the oscillator 4 is formed which generates the highly accurate clock signals. The integrated circuit device 21 can also be referred to as a correction IC that performs the fine adjusted second temperature compensation processing in a digital way.

Specifically, the package 5 is formed of, for example, ceramic and has a housing space inside the package 5. The oscillator 14 in which the vibrator 10 and the integrated circuit device 20 are housed in the package 15, and the integrated circuit device 21 are housed in the housing space. The housing space is hermetically sealed and is preferably in a reduced-pressure state that is a state close to vacuum. The package 5 can suitably protect the integrated circuit device 21 and the oscillator 14 from an impact, dust, heat, moisture, and the like.

The package 5 includes a base 6 and a lid 7. Specifically, the package 5 includes the base 6 that supports the oscillator 14 and the integrated circuit device 21, and the lid 7 bonded to an upper surface of the base 6 to form the housing space between the base 6 and the lid 7. The base 6 includes a first concave portion having an opening in an upper surface and a second concave portion having an opening in a bottom surface of the first concave portion therein. The integrated circuit device 21 is supported on the bottom surface of the first concave portion. For example, the integrated circuit device 21 is supported, via a terminal electrode, by a stepped portion on the bottom surface. Further, the oscillator 14 is supported on a bottom surface of the second concave portion. For example, the oscillator 14 is supported, via a terminal electrode, by a stepped portion on the bottom surface. Further, the base 6 includes a third concave portion having an opening in the bottom surface of the second concave portion. A circuit component 12 is disposed in the third concave portion. For example, a capacitor or a temperature sensor can be assumed as the circuit component 12 to be disposed.

The integrated circuit device 21 is electrically coupled to a terminal of the oscillator 14 via, for example, a bonding wire BW, the terminal electrode formed at the stepped portion, and internal wiring of the package 5. Accordingly, the clock signals and a temperature detection signal from the oscillator 14 can be input to the integrated circuit device 21. Further, the integrated circuit device 21 is electrically coupled, via the bonding wire BW, the terminal electrode formed at the stepped portion, and the internal wiring of the package 5, to external terminals 8 and 9 of the oscillator 4. The external terminals 8 and 9 are formed at an outer bottom surface of the package 5. The external terminals 8 and 9 are coupled, via external wiring, to an external device. The external wiring is, for example, wiring formed at a circuit board on which the external device is mounted. Accordingly, the clock signals or the like can be output to the external device. The terminal of the oscillator 14 and the external terminals 8 and 9 may be electrically coupled to one another.

Although the integrated circuit device 21 is disposed in an upward direction of the oscillator 14 in FIG. 17, the integrated circuit device 21 may be disposed in a downward direction of the oscillator 14. Here, the upward direction is a direction directed from the bottom surface of the package 5 to the lid 7, and the downward direction is a direction opposite to the upward direction. Further, the integrated circuit device 21 may be provided on a side of the oscillator 14. That is, the oscillator 14 and the integrated circuit device 21 are disposed side by side in a top view of the oscillator 4.

Next, the integrated circuit device 21 will be described. The integrated circuit device 21 includes a clock signal generation circuit in which a first clock signal, which is the clock signal generated by the oscillator 14, is input as a reference clock signal. Then, a clock signal generated by the clock signal generation circuit is output to outside as an output clock signal of the oscillator 4. For example, the clock signal generation circuit of the integrated circuit device 21 is configured with a fractional-N PLL circuit in which the first clock signal from the oscillator 14 is input as the reference clock signal. The PLL circuit compares a phase of the reference clock signal that is the first clock signal with a phase of a feedback clock signal obtained by dividing an output clock signal of the PLL circuit with a divider circuit. Then, the fractional-N PLL circuit is implemented by setting a fractional division ratio by using a delta-sigma modulation circuit. Further, the control circuit provided in the integrated circuit device 21 performs, based on temperature compensation data, a correction processing of division ratio data set in the PLL circuit, thereby implementing the second temperature compensation processing. The first temperature compensation processing performed in the oscillator 14 is implemented by, for example, a polynomial approximation temperature compensation processing. Further, the clock signal generation circuit may be configured with a direct digital synthesizer. In this case, the second temperature compensation processing is implemented by inputting frequency control data corrected by the temperature compensation data to the direct digital synthesizer that operates by using the first clock signal as the reference clock signal.

According to the oscillator 4 in FIG. 17, when the integrated circuit device 20 that causes the vibrator 10 to oscillate performs the first temperature compensation processing, a frequency variation amount in a frequency temperature characteristic of the first clock signal output from the integrated circuit device 20 that is the first integrated circuit device can be reduced. Then, when the integrated circuit device 21 that is the second integrated circuit device generates, based on the first clock signal from the integrated circuit device 20, a clock signal, the second temperature compensation processing is performed. After the first temperature compensation processing is performed by the integrated circuit device 20 as described above, the second temperature compensation processing is performed by the integrated circuit device 21, so that a micro-jump of a frequency caused by a variation in a temperature measurement result and the like may be reduced, and high accuracy of a clock frequency of the oscillator 4 and the like can be implemented. Further, in the oscillator 4 in FIG. 17, while performing the first temperature compensation processing by using a temperature sensor provided in the integrated circuit device 20, a temperature detection signal of the temperature sensor may be output from the integrated circuit device 20 and input to the integrated circuit device 21. Then, the integrated circuit device 21 may perform the second temperature compensation processing based on the input temperature detection signal. In this way, since the first temperature compensation processing in the integrated circuit device 20 and the second temperature compensation processing in the integrated circuit device 21 may be performed based on the temperature detection signal from the same temperature sensor, a more appropriate temperature compensation processing can be implemented. In this case, a distance from the temperature sensor built in the integrated circuit device 20 to the vibrator 10 is shorter than a distance from the temperature sensor to the integrated circuit device 21. Therefore, by performing the digital temperature compensation processing, a distance between the integrated circuit device 21 that generates a large amount of heat and the vibrator 10 can be increased, and an adverse effect of the heat generated by the integrated circuit device 21 on a temperature detection result of the temperature sensor can be reduced. Therefore, a temperature of the vibrator 10 may be measured more accurately using the temperature sensor built in the integrated circuit device 20.

6. Electronic Apparatus, and Vehicle

Figure 18:
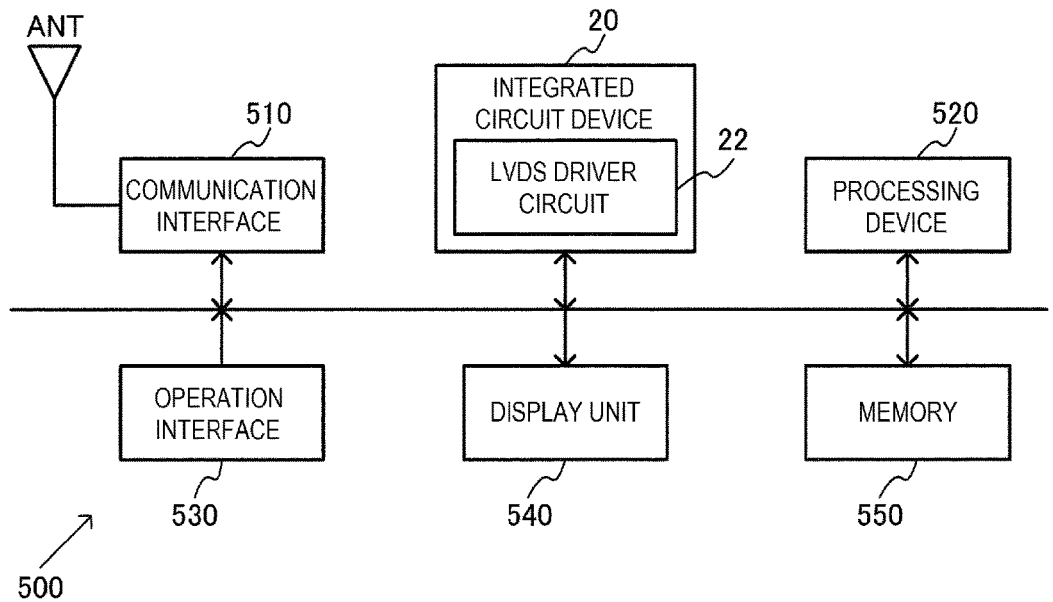
FIG. 18 shows a configuration example of an electronic apparatus.

FIG. 18 shows a configuration example of an electronic apparatus 500 including the LVDS driver circuit 22 in the present embodiment. The electronic apparatus 500 includes the LVDS driver circuit 22 in the present embodiment, and a processing device 520 that operates based on the output signals OUT and OUTX from the LVDS driver circuit 22. Specifically, the electronic apparatus 500 includes the integrated circuit device 20 and the processing device 520. The LVDS driver circuit 22 is provided in the integrated circuit device 20. The integrated circuit device 20 is, for example, a circuit device provided in the oscillator 4 as shown in FIG. 11. In this case, the output signals OUT and OUTX are the clock signals CK and CKX. The processing device 520 operates in accordance with an operation clock signal based on the clock signals CK and CKX. The integrated circuit device 20 is not limited to one provided in the oscillator 4 as described above, and the output signals OUT and OUTX may be data signals. Further, the electronic apparatus 500 can further include an antenna ANT, a communication interface 510, an operation interface 530, a display unit 540, and a memory 550. The electronic apparatus 500 is not limited to the configuration shown in FIG. 18, and various modifications may be made, such as omitting some of these components or adding other components.

The electronic apparatus 500 is, for example, a network-related apparatus such as a base station or a router, a high-precision measurement apparatus that measures a physical quantity such as a distance, time, a flow velocity, or a flow rate, a biological information measurement apparatus that measures biological information, or an in-vehicle apparatus. The biological information measurement apparatus is, for example, an ultrasonic wave measurement device, a pulse wave meter, or a blood pressure measurement device. The in-vehicle apparatus is an apparatus for automatic driving, or the like. Further, the electronic apparatus 500 may be a wearable apparatus such as a head-mounted display device or a timepiece-related apparatus, a mobile information terminal such as a robot, a printing device, a projection device, or a smartphone, a content providing apparatus that distributes contents, or an image apparatus such as a digital camera or a video camera.

As the electronic apparatus 500, there is an apparatus used in a next-generation mobile communication system such as 5G. For example, the LVDS driver circuit 22 and the integrated circuit device 20 in the present embodiment can be used for various apparatuses such as a base station, a remote radio head (RRH), or a mobile communication terminal of the next-generation mobile communication system. In the next-generation mobile communication system, a high-accuracy clock frequency is required for time synchronization and the like, which is suitable as an application example of the integrated circuit device 20 in the present embodiment which can generate a high-accuracy clock signal.

The communication interface 510 performs, via the antenna ANT, a processing of receiving data from outside and transmitting data to the outside. The processing device 520 that is a processor performs a control processing of the electronic apparatus 500, various digital processings of data transmitted or received via the communication interface 510, and the like. A function of the processing device 520 can be implemented by, for example, a processor such as a microcomputer. The operation interface 530 is for a user to perform an input operation, and can be implemented by an operation button, a touch panel display, or the like. The display unit 540 displays various types of information and can be implemented by a display such as a liquid crystal or an organic EL. The memory 550 stores data, and a function thereof can be implemented by a semiconductor memory such as a RAM or a ROM.

Figure 19:
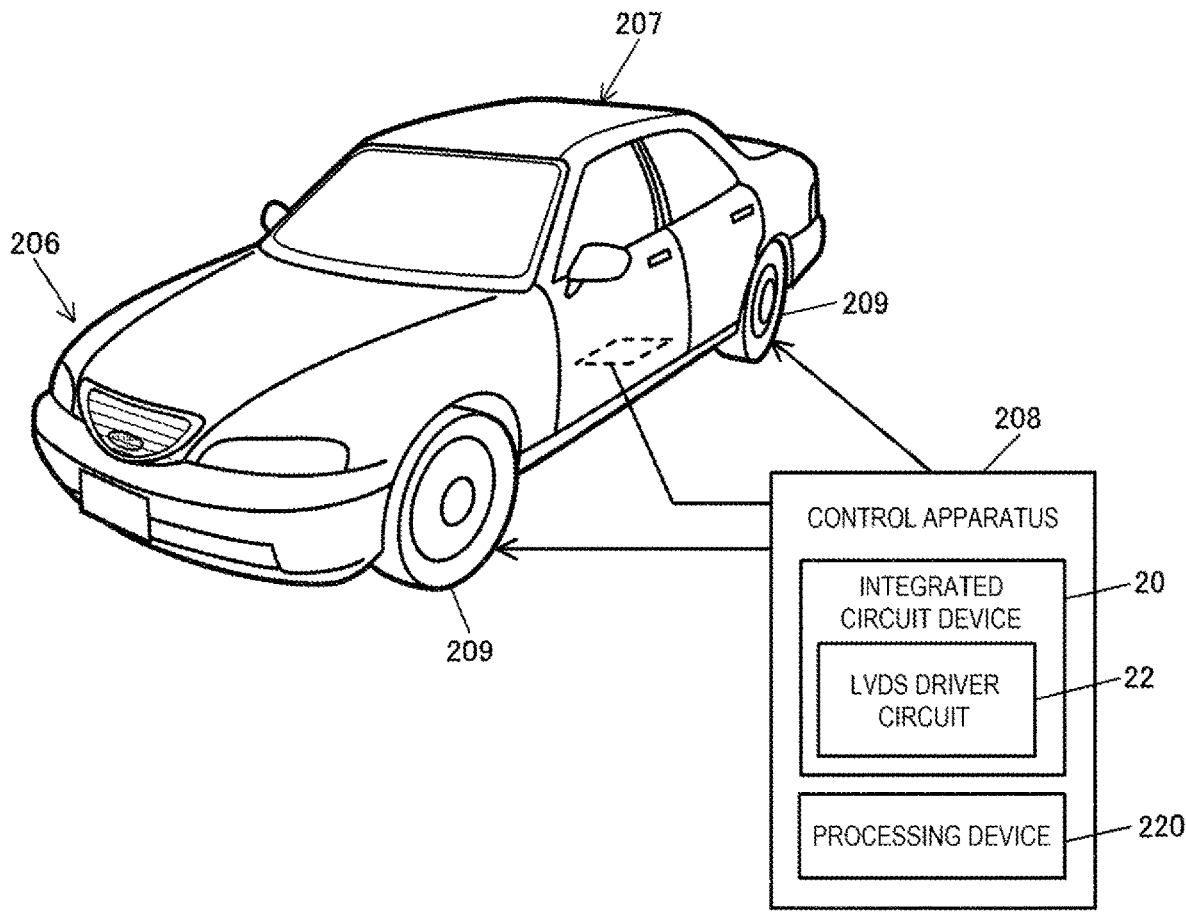
FIG. 19 shows a configuration example of a vehicle.

FIG. 19 shows an example of a vehicle including the LVDS driver circuit 22 in the present embodiment. The vehicle includes the LVDS driver circuit 22 in the present embodiment, and the processing device 220 that operates based on the output signals OUT and OUTX of the LVDS driver circuit 22. Specifically, the vehicle includes the integrated circuit device 20 and the processing device 520. The LVDS driver circuit 22 is provided in the integrated circuit device 20. Further, the integrated circuit device 20 and the processing device 520 are provided in a control apparatus 208. For example, when the output signals OUT and OUTX are the clock signals CK and CKX, the processing device 220 operates in accordance with the operation clock signal based on the clock signals CK and CKX. However, the output signals OUT and OUTX may be data signals. The LVDS driver circuit 22 in the present embodiment can be incorporated in, for example, various vehicles such as a car, an airplane, a motorcycle, a bicycle, or a ship. The vehicle is, for example, an apparatus or a device that includes a driving mechanism such as an engine or a motor, a steering mechanism such as a steering wheel or a rudder, and various electronic apparatuses, and that moves on ground, in sky, or on sea. FIG. 19 schematically shows an automobile 206 serving as a specific example of the vehicle. The LVDS driver circuit 22 in the present embodiment is incorporated in the automobile 206. Specifically, the automobile 206 that is the vehicle includes the control apparatus 208. The control apparatus 208 includes the LVDS driver circuit 22 and the processing device 220 that operates based on the output signals OUT and OUTX of the LVDS driver circuit 22 in the present embodiment. The control apparatus 208 controls hardness or softness of a suspension, for example, in accordance with a posture of a vehicle body 207, and controls brakes of wheels 209. For example, automatic driving of the automobile 206 may be implemented by the control apparatus 208. The apparatus in which the LVDS driver circuit 22 in the present embodiment is incorporated is not limited to such a control apparatus 208, and may be incorporated in various in-vehicle apparatuses such as a meter panel apparatus or a navigation apparatus provided in the vehicle such as the automobile 206.

As described above, the LVDS driver circuit in the present embodiment is the LVDS driver circuit having the high impedance mode and the signal output mode, and includes (i) the current source that supplies the current, and (ii) the differential unit that is provided between the current source and the first node, receives the first input signal and the second input signal that constitute the differential input signal, and outputs the first output signal and the second output signal that constitute the differential output signal. Further, the LVDS driver circuit includes (iii) the transistor provided between the first node and the ground node, and (iv) the feedback control circuit that is coupled to the first output node from which the first output signal is output and to the second output node from which the second output signal is output, and that performs, by outputting the control voltage to the gate of the transistor, the feedback control that sets the common voltage of the differential output signal. In the differential unit, the first output node and the second output node are in the high impedance state in the high impedance mode. The differential unit outputs the first output signal and the second output signal in the signal output mode. The control voltage in the high impedance mode is larger than the control voltage in the signal output mode.

According to the present embodiment, the feedback control circuit performs, by outputting the control voltage to the gate of the transistor, the feedback control that sets the common voltage of the differential output signal including the first output signal and the second output signal. On the other hand, in the differential unit, the first output node and the second output node are in the high impedance state in the high impedance mode. The differential unit outputs the first output signal and the second output signal in the signal output mode. In the present embodiment, the control voltage in the high impedance mode is larger than the control voltage in the signal output mode. By increasing the control voltage in this way, for example, when the mode is switched from the high impedance mode to the signal output mode, the transistor can be turned on, and the overshoot can be prevented from occurring in the first output signal and the second output signal. Further, according to the configuration of the present embodiment, since the overshoot can be prevented without necessarily providing a bypass circuit as described in JP-A-2005-109897, an increase in power consumption can be prevented.

In the present embodiment, the switch provided between the power supply node and the output node of the control voltage of the feedback control circuit may be provided. The switch may be turned on in the high impedance mode and turned off in the signal output mode.

In this way, when the switch is turned on in the high impedance mode, the output node of the control voltage is set to the power supply voltage level, and the occurrence of the overshoot can be prevented.

In the present embodiment, the feedback control circuit may perform, using the reference voltage that sets the common voltage, the feedback control so that the intermediate voltage between the voltage of the first output node and the voltage of the second output node of the differential unit is the common voltage.

In this way, the common voltage is set based on the reference voltage, and the differential output signal of the LVDS having the common voltage as the center voltage can be output.

In the present embodiment, the feedback control circuit may include (i) the first detection resistor and the first detection switch that are provided in series between the first output node and the detection node, (ii) the second detection resistor and the second detection switch that are provided in series between the second output node and the detection node, and (iii) the operational amplifier in which the detection voltage in the detection node is input to the non-inverting input terminal and the reference voltage is input to the inverting input terminal, and that outputs the control voltage to the gate of the transistor.

In this way, the feedback control can be implemented so that the intermediate voltage between the voltage of the first output node and the voltage of the second output node of the differential unit is the common voltage of the differential output signal.

In the present embodiment, the feedback control circuit may include the operational amplifier that outputs the control voltage. The LVDS driver circuit may include the switch provided between the power supply node and the non-inverting input terminal of the operational amplifier. The switch may be turned on in the high impedance mode and turned off in the signal output mode.

In this way, when the switch is turned on in the high impedance mode, the non-inverting input terminal of the operational amplifier is set to the power supply voltage level. Accordingly, the control voltage output from the operational amplifier is also set to the power supply voltage level, and the occurrence of the overshoot can be prevented.

In the present embodiment, the feedback control circuit may perform, using the reference voltage that sets the common voltage, the feedback control so that the intermediate voltage between the voltage of the first output node and the voltage of the second output node of the differential unit is the common voltage. The detection voltage corresponding to the intermediate voltage may be input to the non-inverting input terminal of the operational amplifier, and the reference voltage may be input to the inverting input terminal of the operational amplifier.

In this way, the feedback control, which sets the intermediate voltage between the voltage of the first output node and the voltage of the second output node of the differential unit to be the common voltage of the differential output signal, can be implemented using the virtual grounding of the operational amplifier.

In the present embodiment, the resistor provided in parallel with the transistor may be provided between the first node and the ground node.

In this way, the sink current source can be implemented in which the on-resistance of the transistor and the resistance value of the resistor become the combined resistance.

In the present embodiment, the differential unit may include the P-type first transistor that is provided between the current source and the second output node and whose gate receives the first input signal, and the P-type second transistor that is provided between the current source and the first output node and whose gate receives the second input signal. Further, the differential unit may include the N-type third transistor that is provided between the second output node and the first node and whose gate receives the first input signal, and the N-type fourth transistor that is provided between the first output node and the first node and whose gate receives the second input signal.

According to the differential unit having such a configuration, the first output signal and the second output signal that constitute the differential output signal of the LVDS can be appropriately output in accordance with the first input signal and the second input signal that constitute the differential input signal.

In the present embodiment, the differential unit may include the first switch provided in series with the first transistor and between the current source and the second output node, and the second switch provided in series with the second transistor and between the current source and the first output node. Further, the differential unit may include the third switch provided in series with the third transistor and between the second output node and the first node, and the fourth switch provided in series with the fourth transistor and between the first output node and the first node. Then, in the high impedance mode, the first switch, the second switch, the third switch, and the fourth switch may be turned off, and in the signal output mode, the first switch, the second switch, the third switch and the fourth switch may be turned on.

In this way, when the first switch, the second switch, the third switch, and the fourth switch are turned off, the first output node and the second output node of the differential unit are in the high impedance state, and the high impedance mode can be implemented.

In the present embodiment, in the high impedance mode, the second transistor and the third transistor may be turned on and the first transistor and the fourth transistor may be turned off, or the first transistor and the fourth transistor may be turned on and the second transistor and the third transistor may be turned off.

In this way, when the mode is switched from the high impedance mode to the signal output mode, the signal output can be started in the state where the first output signal and the second output signal are at the appropriate voltage levels, and the situation where the signal output is unstable can be prevented.

In the present embodiment, in the high impedance mode, the first transistor, the second transistor, the third transistor, and the fourth transistor may be turned off.

In this way, when the first transistor, the second transistor, the third transistor, and the fourth transistor are turned off, the first output node and the second output node of the differential unit are in the high impedance state, and the high impedance mode can be implemented.

The present embodiment relates to the integrated circuit device including (i) the oscillation circuit that generates the oscillation signal by causing the vibrator to oscillate, and (ii) the output circuit that includes the LVDS driver circuit described above and that outputs, based on the oscillation signal, the first output clock signal as the first output signal and the second output clock signal as the second output signal.

The present embodiment relates to the oscillator including the integrated circuit device and the vibrator that are described above.

The present embodiment relates to the electronic apparatus including the LVDS driver circuit described above and the processing device that operates based on the first output signal and the second output signal.

The present embodiment relates to the vehicle including the LVDS driver circuit described above and the processing device that operates based on the first output signal and the second output signal.

Although the present embodiment has been described in detail as described above, it will be readily apparent to those skilled in the art that many modifications may be made without departing substantially from novel matters and effects of the present disclosure. Therefore, all such modifications are intended to be included within the scope of the present disclosure. For example, a term cited with a different term having a broader meaning or the same meaning at least once in the disclosure or on the drawings can be replaced with the different term in anyplace in the disclosure or on the drawings. Further, all combinations of the embodiment and the modifications are also included in the scope of the present disclosure. Further, the configurations, the operations and the like of the LVDS driver circuit, the integrated circuit device, the oscillator, the electronic apparatus, and the vehicle are not limited to those described in the present embodiment, and various modifications may be made.

What is claimed is:

1. An LVDS driver circuit having a high impedance mode and a signal output mode, the LVDS driver circuit comprising:
    a current source configured to supply a current;
    a differential unit provided between the current source and a first node, and configured to receive a first input signal and a second input signal that constitute a differential input signal and output a first output signal and a second output signal that constitute a differential output signal;
    a transistor provided between the first node and a ground node; and
    a feedback control circuit configured to be coupled to a first output node from which the first output signal is output and to a second output node from which the second output signal is output, and configured to perform, by outputting a control voltage to a gate of the transistor, feedback control that sets a common voltage of the differential output signal, wherein
    in the differential unit, the first output node and the second output node are in a high impedance state in the high impedance mode, and the differential unit is configured to output the first output signal and the second output signal in the signal output mode, and the control voltage in the high impedance mode is larger than the control voltage in the signal output mode.

2. The LVDS driver circuit according to claim 1, further comprising:
a switch provided between a power supply node and an output node of the control voltage of the feedback control circuit, wherein
the switch is turned on in the high impedance mode and turned off in the signal output mode.

3. The LVDS driver circuit according to claim 1, wherein the feedback control circuit is configured to perform, using a reference voltage that sets the common voltage, feedback control such that an intermediate voltage between a voltage of the first output node and a voltage of the second output node of the differential unit is the common voltage.

4. The LVDS driver circuit according to claim 3, wherein the feedback control circuit includes
a first detection resistor and a first detection switch provided in series between the first output node and a detection node,
a second detection resistor and a second detection switch provided in series between the second output node and the detection node, and
an operational amplifier in which a detection voltage in the detection node is input to an non-inverting input terminal and the reference voltage is input to an inverting input terminal, and that is configured to output the control voltage to a gate of the transistor.

5. The LVDS driver circuit according to claim 1, wherein the feedback control circuit includes an operational amplifier configured to output the control voltage,
the LVDS driver circuit includes a switch provided between a power supply node and a non-inverting input terminal of the operational amplifier, and
the switch is turned on in the high impedance mode and turned off in the signal output mode.

6. The LVDS driver circuit according to claim 5, wherein the feedback control circuit is configured to perform, using a reference voltage that sets the common voltage, feedback control such that an intermediate voltage between a voltage of the first output node and a voltage of the second output node of the differential unit is the common voltage, and
a detection voltage corresponding to the intermediate voltage is input to the non-inverting input terminal of the operational amplifier, and the reference voltage is input to an inverting input terminal of the operational amplifier.

7. The LVDS driver circuit according to claim 1, wherein a resistor provided in parallel with the transistor is provided between the first node and the ground node.

8. The LVDS driver circuit according to claim 1, wherein the differential unit includes
a P-type first transistor that is provided between the current source and the second output node and whose gate receives the first input signal,
a P-type second transistor that is provided between the current source and the first output node and whose gate receives the second input signal,
an N-type third transistor that is provided between the second output node and the first node and whose gate receives the first input signal, and
an N-type fourth transistor that is provided between the first output node and the first node and whose gate receives the second input signal.

9. The LVDS driver circuit according to claim 8, wherein the differential unit includes
a first switch provided in series with the first transistor between the current source and the second output node,
a second switch provided in series with the second transistor between the current source and the first output node,
a third switch provided in series with the third transistor between the second output node and the first node, and
a fourth switch provided in series with the fourth transistor between the first output node and the first node, in which
in the high impedance mode, the first switch, the second switch, the third switch, and the fourth switch are turned off, and in the signal output mode, the first switch, the second switch, the third switch, and the fourth switch are turned on.

10. The LVDS driver circuit according to claim 9, wherein in the high impedance mode, the second transistor and the third transistor are turned on and the first transistor and the fourth transistor are turned off, or the first transistor and the fourth transistor are turned on and the second transistor and the third transistor are turned off.

11. The LVDS driver circuit according to claim 8, wherein in the high impedance mode, the first transistor, the second transistor, the third transistor, and the fourth transistor are turned off.

12. An integrated circuit device comprising:
an oscillation circuit configured to generate an oscillation signal by causing a vibrator to oscillate; and
an output circuit that includes the LVDS driver circuit according to claim 1 and that is configured to output, based on the oscillation signal, a first output clock signal as the first output signal and a second output clock signal as the second output signal.

13. An oscillator comprising:
the integrated circuit device according to claim 12; and
the vibrator.

14. An electronic apparatus comprising:
the LVDS driver circuit according to claim 1; and
a processing device configured to operate based on the first output signal and the second output signal.

15. A vehicle comprising:
the LVDS driver circuit according to claim 1; and
a processing device configured to operate based on the first output signal and the second output signal.

* * * * *